United States Patent
Gupta et al.

(10) Patent No.: US 11,589,481 B2
(45) Date of Patent: Feb. 21, 2023

(54) HEAT SINK ASSEMBLY FOR ELECTRONIC EQUIPMENT

(71) Applicant: Cisco Technology, Inc., San Jose, CA (US)

(72) Inventors: Rohit Dev Gupta, Bangalore (IN); Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 165 days.

(21) Appl. No.: 16/993,885

(22) Filed: Aug. 14, 2020

(65) Prior Publication Data

US 2022/0053669 A1 Feb. 17, 2022

(51) Int. Cl.
H05K 7/20 (2006.01)

(52) U.S. Cl.
CPC ....... H05K 7/20709 (2013.01); H05K 7/2039 (2013.01)

(58) Field of Classification Search
CPC .. H05K 7/2039; H05K 7/20709; H01L 23/40; G06F 1/20; G06F 1/203; G06F 1/206
See application file for complete search history.

(56) References Cited

U.S. PATENT DOCUMENTS

| | | |
|---|---|---|
| 7,712,980 B2 | 5/2010 | Tokita et al. |
| 8,217,558 B2 | 7/2012 | Bancken et al. |
| 8,535,787 B1 | 9/2013 | Lima |
| 8,876,412 B2 | 11/2014 | Aoki et al. |
| 10,310,565 B2 * | 6/2019 | Aoki ................. G06F 1/1652 |
| 10,401,581 B2 | 9/2019 | Gaal |
| 2013/0081389 A1 * | 4/2013 | Browne ................ F03G 7/065 60/527 |
| 2016/0351526 A1 * | 12/2016 | Boyd .................... H01L 24/75 |
| 2019/0056835 A1 * | 2/2019 | Xia ...................... G06F 1/203 |
| 2019/0176722 A1 * | 6/2019 | Saele ..................... F16B 9/05 |
| 2019/0246488 A1 * | 8/2019 | Kuklinski ......... H01L 23/4093 |
| 2020/0100386 A1 * | 3/2020 | Saturley ............. H05K 7/2049 |

(Continued)

FOREIGN PATENT DOCUMENTS

DE 202020102450 U1 * 8/2020
EP 3543753 A1 * 9/2019 ............. F28F 21/04

OTHER PUBLICATIONS

DE-202020102450-U1 EPO Translation (Year: 2020).*

*Primary Examiner* — Jianying C Atkisson
*Assistant Examiner* — Christopher C Pillow
(74) *Attorney, Agent, or Firm* — Edell, Shapiro & Finnan, LLC

(57) ABSTRACT

A heat sink assembly for a cage for a field replaceable computing module includes a heat sink, a thermal interface material (TIM), and an actuation assembly. The heat sink includes a mating surface. The TIM includes a first surface that is coupled to the mating surface and a second surface that is opposite the first surface. Thus, the second surface can engage a heat transfer surface of a field replaceable computing module installed adjacent the heat sink. The actuation assembly includes a shape memory alloy (SMA) element. When the SMA element is in a first position, the second surface of the TIM contacts the heat transfer surface of the computing module. When the SMA element moves to a second position, the second surface of the TIM is moved a distance away from the heat transfer surface of the computing module.

20 Claims, 18 Drawing Sheets

(56) References Cited

U.S. PATENT DOCUMENTS

| | | | |
|---|---|---|---|
| 2020/0163249 A1* | 5/2020 | So | H05K 7/20727 |
| 2020/0229318 A1* | 7/2020 | Grau | H01L 23/40 |
| 2020/0260615 A1* | 8/2020 | Leigh | G06F 1/20 |

* cited by examiner

HEAT SINK ASSEMBLY FOR ELECTRONIC EQUIPMENT

TECHNICAL FIELD

The present disclosure relates to high performance and/or high density computing solutions, such as line cards and computing blades, that can receive field replaceable computing modules, and in particular to a heat sink assembly for these computing solutions.

BACKGROUND

Over the past several years, the information technology field has seen a tremendous increase in the performance of electronic equipment coupled with a decrease in geometric floor space to house the equipment. For instance, due at least to recent advances in high throughput computing, field replaceable computing modules, such as optical transceivers, are dissipating more power (e.g., 25 Watts (W) or more) in smaller form factors (i.e., computing modules are being provided with increasingly higher power densities). However, permissible operating temperatures, which may be defined by temperature limits of internal components included in the field replaceable computing modules, have remained relatively stagnant. Moreover, as computing solutions become denser, less space is available for cooling solutions. Thus, cooling solutions for field replaceable computing modules that can provide improved cooling in smaller form factors are continuously desired.

BRIEF DESCRIPTION OF THE DRAWINGS

Like reference numerals have been used to identify like elements throughout this disclosure.

DESCRIPTION OF EXAMPLE EMBODIMENTS

Overview

Figure 1A:
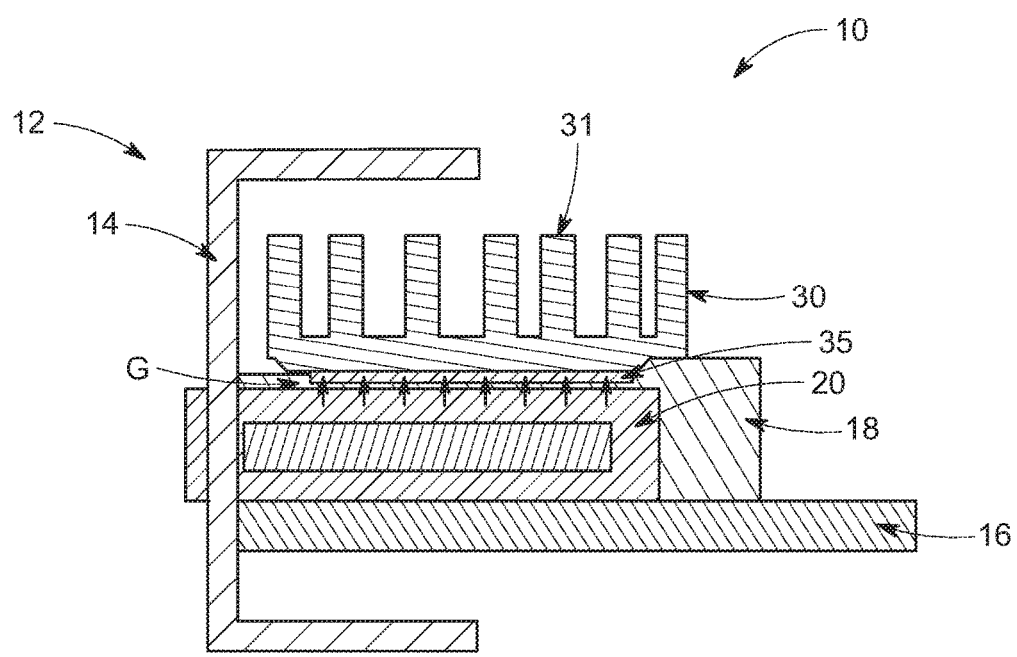
FIG. 1A is a schematic side view of an example embodiment of a heat sink assembly formed in accordance with the present application.

A heat sink assembly for a cage for a field replaceable computing module, an apparatus including the cage, and a system including the apparatus and the field replaceable computing module are presented herein. In one embodiment, a heat sink assembly for a cage for a field replaceable computing module includes a heat sink, a thermal interface material, and an actuation assembly. The heat sink facilitates heat dissipation and includes a mating surface. The thermal interface material includes a first surface that is coupled to the mating surface of the heat sink and a second surface that is opposite the first surface. Thus, the second surface can engage a heat transfer surface of a field replaceable computing module installed adjacent to the heat sink. The actuation assembly includes a shape memory alloy (SMA) element. When the SMA element is in a first position, the second surface of the thermal interface material contacts the heat transfer surface of the field replaceable computing module, and when the SMA element is moved to a second position, the second surface of the thermal interface material is moved a distance away from the heat transfer surface of the field replaceable computing module.

Example Embodiments

The heat sink assembly presented herein enables high performance and/or high density computing solutions, such as line cards and computing blades, to effectively dissipate heat from field replaceable computing modules without inhibiting insertion or removal of the field replaceable computing modules (also referred to herein as "modules," "pluggable modules," "swappable modules," and the like), such as during online insertion and removal ("OIR") operations. Specifically, the heat sink assembly presented provides a movable or "floating" heat sink and an actuation assembly that can move the floating heat sink towards and/or away from a module cage included in a computing solution.

Notably, the heat sink assembly presented herein may be primarily actuated via an electrical actuation. Thus, the actuator may occupy a minimal amount of space on a front panel of a computing solution, which may be beneficial, if not required, for computing solutions with dense front panel layouts. In fact, in some instances, the heat sink assembly presented herein may be actuated via a purely electrical actuation (i.e., only an electrical actuation). In these instances, the heat sink assembly need not include a physical/mechanical actuator. That is, in at least some instances, the heat sink assembly may eliminate any need for a physical/mechanical actuator. Regardless, the heat sink assembly presented herein can also lock a heat sink in a raised position or a lowered position, which may simplify insertion and removal of a module. This locking may also allow that the heat sink assembly presented herein to compress a heat sink and a thermal interface material ("TIM") included thereon against a module.

Moreover, in at least some embodiments, the actuation assembly moves the entire heat sink away from the module cage (and/or a module installed therein), thereby reducing, if not eliminating, the risk of a module scraping against the heat sink assembly during insertion or removal operations. In fact, the actuation assembly may move the heat sink so that the mating surface of the heat sink (e.g., a bottom surface) remains parallel to a heat transfer surface of a module (e.g., a top surface). Consequently, during insertion or removal of the module, the entire mating surface of the heat sink (e.g., the bottom surface) will be equally spaced apart from the heat transfer surface of the module (e.g., the top surface) by a gap and the module will not rub or slide against the mating surface of the heat sink. This gap, in turn, allows a TIM, which would be damaged by sliding or rubbing, to be included on the mating surface. The TIM increases thermal conductivity between the heat sink and a module and, thus, improves cooling for the module. Additionally, parallel motion of the heat sink with respect to the module cage may provide a substantially consistent gap between the heatsink and the module, which may allow the gap required for module removal to be minimized.

Additionally or alternatively, the actuation assembly may move the heat sink along one degree of freedom (e.g., vertically). Moving the heat sink along one degree of freedom (e.g., vertically) may ensure that the heat sink does not need to be positioned adjacent open space, which is necessary when a heat sink moves in a lateral or depth direction (e.g., a front-to-back direction). Instead, the surface area of the heat sink size may be maximized to span a perimeter of a module and/or module cage and the cage need not be positioned with open space surrounding its peripheral boundaries. That is, moving the heat sink along one degree of freedom may maximize a thermal contact area. Furthermore, moving the heat sink along one degree of freedom may allow the heat sink to generate compression forces on a TIM (e.g., if the one degree of freedom is linear, vertical movement) that are often necessary to maximize TIM performance with the assembly that moves the heat sink. This may reduce the number of components in the assembly, reducing costs of manufacture and servicing. The TIM also tends to reduce, if not eliminate, the effects of minor dimensional differences between different pluggable modules.

In order to describe the heat sink assembly, computing apparatus, and computing system presented herein, terms such as "left," "right," "top," "bottom," "front," "rear," "side," "height," "length," "width," "upper," "lower," "interior," "exterior," "inner," "outer," "depth," and the like as may be used. However, it is to be understood that these terms merely describe points of reference and do not limit the embodiments to any particular orientation or configuration. For example, the terms "height," "width," and "depth" may be used to describe certain embodiments presented herein, but it is to be understood that these terms are not intended to limit the present application to specific implementations. Instead, in at least some embodiments, the heat sink assembly presented herein may be oriented horizontally (as shown) or vertically (i.e., a housing of a computing solution may be rotated 90 degrees about an axis extending through a front and back of the housing), or in any other manner during use (e.g., when installed into a blade chassis/enclosure). Consequently, even if a certain dimension is described herein as a "width," it may be understood that this dimension may provide a height or depth when a computing solution in which it is included is moved to different orientations.

Now turning to FIG. 1A, this Figure schematically illustrates an example embodiment of a computing solution 10 that includes an example embodiment of the heat sink assembly 30 presented herein (for simplicity, at least some components of the heat sink assembly 30 are not shown in FIG. 1A). The computing solution 10 may also be referred to as a computing system; however, it is to be understood that the term "system," when used herein, does not imply that the solution/system 10 is a stand-alone system. Instead, a solution/system 10 may be a stand-alone system or a portion/subsystem of a larger system (e.g., solution 10 may be a blade of a server). That said, in FIG. 1A, the computing solution 10 includes an apparatus 12 and a removable computing module 20. The apparatus 12 includes a housing 14 that houses a PCB 16 and a module cage 18 (e.g., an optical cage). Additionally, the housing 14 houses a heat sink assembly 30 with a heat sink 31 and a thermal interface material (TIM) 35. The TIM 35 is included on a bottom or mating surface of the heat sink 31 and, as is depicted, during insertion or removal of the computing module 20 into the module cage 18, the heat sink assembly 30 moves the heat sink 31 and TIM 35 away from the module cage 18 to provide a gap "G" between the computing module 20 and the TIM 35.

In the depicted embodiment, the heat sink assembly 30 moves the heat sink 31 and the TIM 35 upwards. More specifically, the heat sink assembly 30 moves the entire heat sink 31 and entire TIM 35 upwards, away from the module cage 18. In at least some embodiments, the heat sink assembly 30 moves the heat sink 31 and TIM 35 while keeping the TIM 35 parallel to a top of the module cage 18. Alternatively, the heat sink 31 and TIM 35 might be moved upwards in any manner, but are moved into a raised position that is parallel to a top of the module cage 18. Still further, in some embodiments, the TIM 35 is not parallel to the top of the module cage 18 when in a raised position, but is spaced apart from the top of the module cage 18 across its surface area (e.g., so that the gap G spans the whole TIM 35). Regardless of how the heat sink 31 and TIM 35 are moved to a raised position (and regardless of how the TIM 35 is oriented in its raised position), the gap G allows the computing module 20 to be inserted into or removed from module cage 18 without contacting and damaging TIM 35. If, instead, only a portion of the TIM 35 was moved away from the module cage 18 (e.g., if the heat sink assembly 30 was tipped about a lateral axis, which would extend into the plane of the drawing sheet on which FIG. 1A is included), the computing module 20 might contact and damage the TIM 35 (e.g., by scraping a portion of the TIM 35 off of the heat sink assembly 30).

Figure 1B:
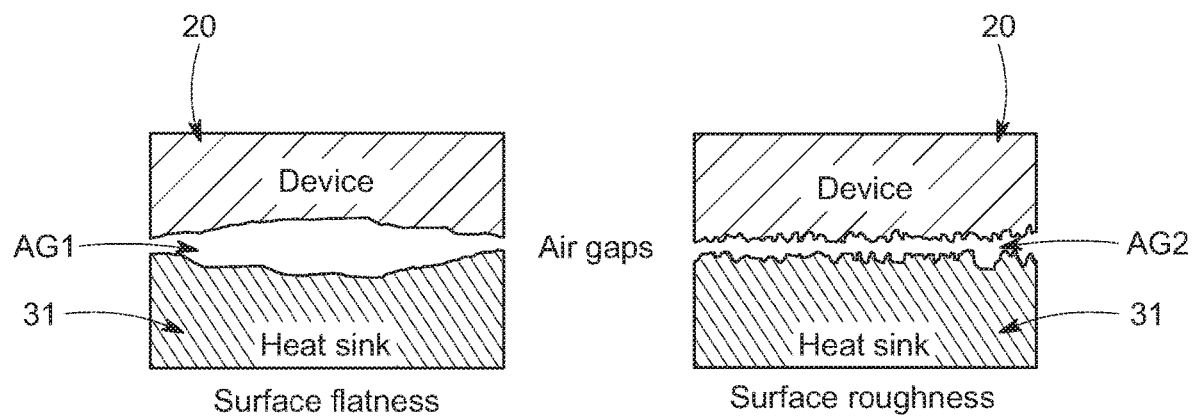
FIG. 1B is a diagram illustrating heat transfer between a field replaceable computing module and conventional heat sinks.

Alternatively, and now turning to FIG. 1B, if the heat sink assembly 30 does not include a TIM 35, a metal surface of a heat sink 31 included in the heat sink assembly 30 might not form an effective thermal connection with the computing module 20. For example, since metal surfaces (e.g., a bottom of a heat sink and/or top of a module) can have surface irregularities, such as flatness irregularities, waviness irregularities, roughness irregularities, etc., air gaps may form between the metal surfaces of a heat sink 31 and a computing module 20. In FIG. 1B, the left image illustrates air gaps AG1 that form between metal surfaces with surface flatness irregularities while the right image illustrates air gaps AG2 that form between metal surfaces with surface roughness irregularities. Notably, many riding heat sinks, which are often biased into contact with a module via spring clips that press the heat sink against a module during insertion or removal, provide inefficient heat transfer away from computing modules 20 due to air gap issues. These issues cannot be remedied by a TIM 35, because the TIM would be scraped off or otherwise damaged as a heat sink "rides" on a sliding module. Regardless of how air gaps form between the module 20 and the heat sink assembly 30, air gaps are detrimental to heat transfer because the low thermal conductivity of air provides significant contact resistance. A TIM can reduce or eliminate these air gaps and significantly reduce contact resistance, especially if the TIM is compressed to a specific compression to maximize heat transfer (which may differ for different materials).

Figure 2A:
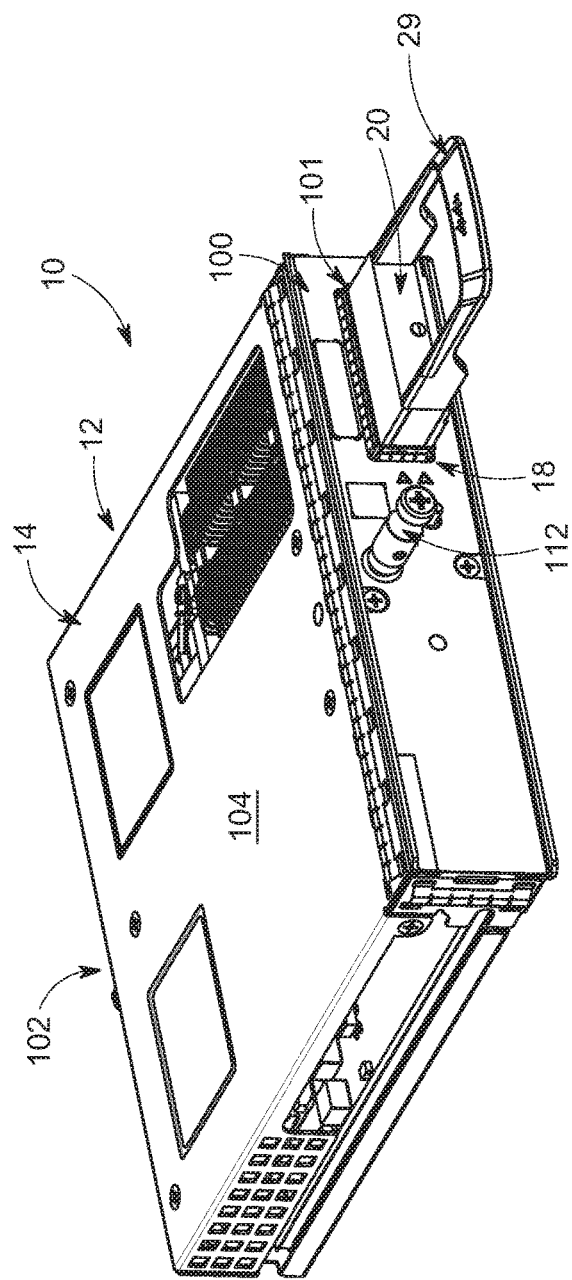
FIG. 2A illustrates a front perspective view of an example embodiment of a computing solution that includes an example embodiment of the heat sink assembly presented herein.

FIG. 2A illustrates a top perspective view of a computing apparatus 12 and a replaceable computing module 20 that may be installed within the apparatus 12 to form a computing solution 10. As is shown, the computing apparatus 12 includes a front surface or panel 100 with an opening 101 that provides access to the module cage 18 defined therein. In the depicted embodiment, the module cage 18 extends in a depth direction (e.g., front-to-back) within the housing 14 of the apparatus 12. That is, the module cage 18 extends from the front panel 100 towards a back end 102 of the housing 14. Additionally, in the depicted embodiment, the module cage 18 is arranged to be substantially flat within the housing 14, such that the module cage 18 is parallel to a cover 104 that defines a top of the housing 14.

Figure 2B:
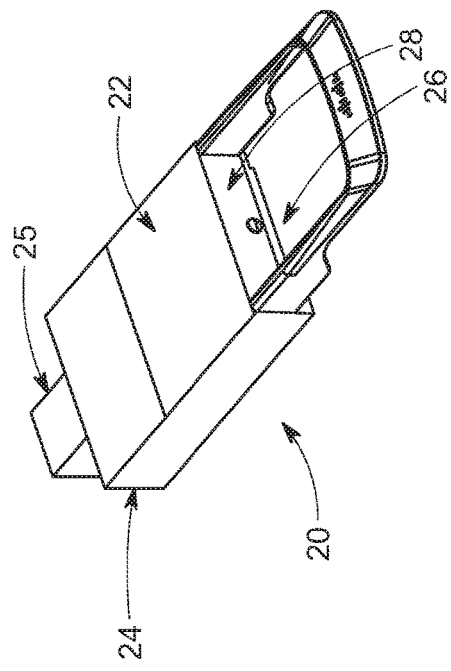
FIG. 2B illustrates a field replaceable computing module included in the computing solution of FIG. 2A.

Meanwhile, and now referring to FIG. 2A in combination with FIG. 2B, the module 20 includes a top surface 22, a back surface 24 with a connector 25, a bottom surface 26, and a front surface 28. As is discussed in further detail below, in the depicted embodiment, the top surface 22 of the computing module 20 is a heat transfer surface for the computing module 20. However, in other embodiments, any surface of the computing module 20 could serve as a heat transfer surface. During insertion of the computing module 20 into the module cage 18, the perimeter of back surface 24 is aligned with the module cage 18 and then the computing module 20 is pushed into the module cage 18 to connect the connector 25 on the back surface 24 with a connector 124 included in the module cage 18 (see FIG. 3B). During removal of the computing module 20 from the module cage 18, the front surface 28 may be grasped, e.g., by handle 29, and pulled out of the module cage 18. However, handle 29 is merely representative of a feature that enables a user to easily grasp the front surface 28 and, in other embodiments, the module 20 could include any other features instead of or in addition to handle 29. Alternatively, the computing module 20 can be ejected or removed from the module cage 18 in any manner now known or developed hereafter (including mechanical ejections). Before or after the computing module 20 is installed in the module cage 18, the housing 14 may be installed into another computing solution (e.g., a rack) and secured thereto with installation member 112 (see FIGS. 2A and 3A).

In FIG. 2A (as well as many other Figures), the computing solution 10 is a line card; however, it is to be understood that a line card is simply one example of a computing solution in which the heat sink assembly presented herein may be included. For example, the computing solution 10 could also be a rack server, a storage drawer, a stand-alone computing solution, or any other computing solution that accepts modular computing components (e.g., "field replaceable computing modules"). Likewise, in FIGS. 2A and 2B (as well as many other Figures), the module 20 is an optical transceiver, but it is to be understood that an optical transceiver is simply one example of a module with which the heat sink assembly presented herein may be used. That said, it may be beneficial to utilize the heat sink presented herein with optical transceivers because technical advancements in optical transceivers have generated high power dissipation (e.g., 25 W or more) in a small form factor (e.g., C form-factor pluggable 2 ("CFP2") form factor, which has dimensions of 41.5 millimeters ("mm")×12.4 mm×107.5 mm (w×h×d)). These characteristics make it difficult to satisfy Network Equipment-Building System (NEBS) thermal standards for these modules.

Figure 3A:
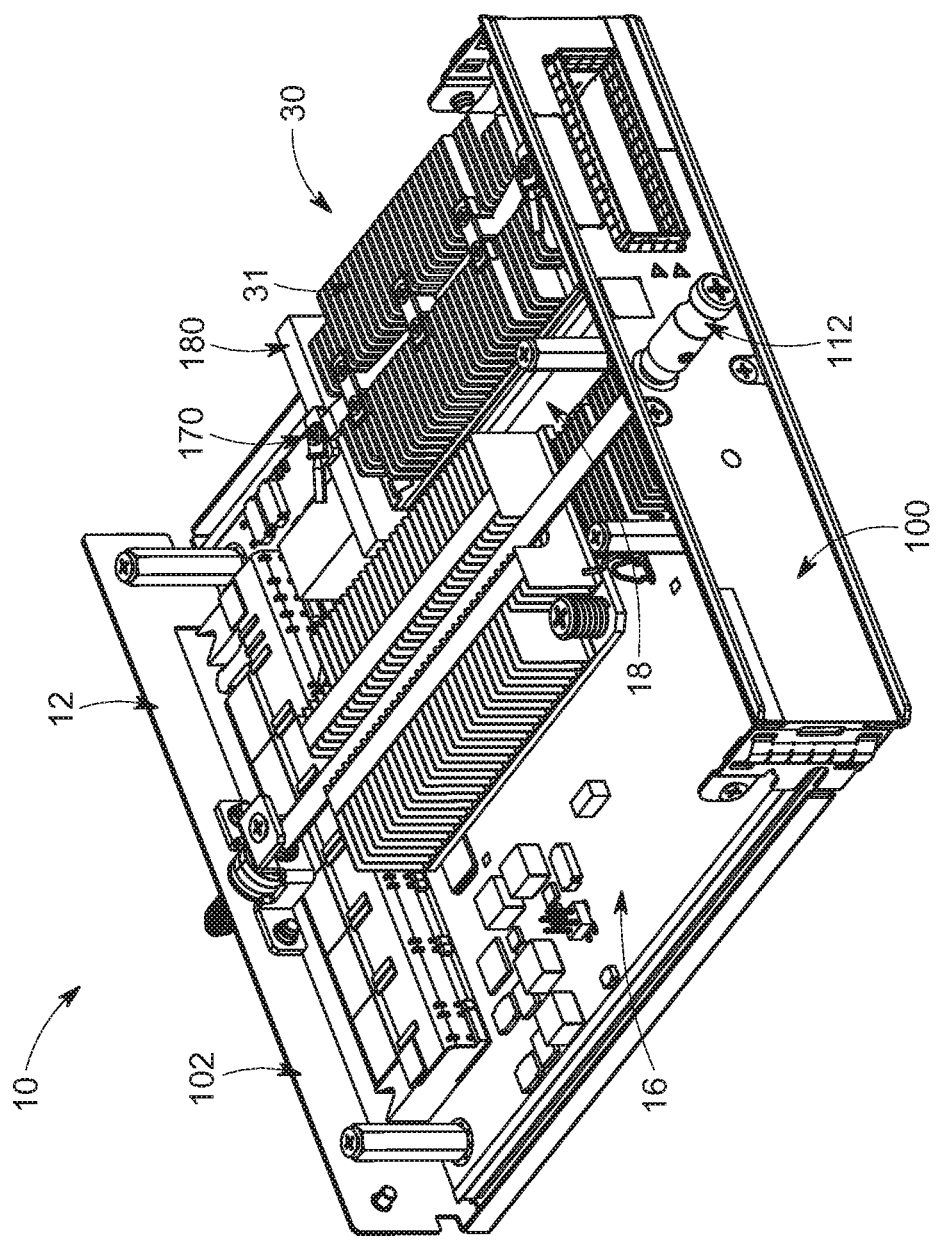
FIG. 3A illustrates a front perspective view of a computing apparatus of the computing solution of FIG. 2A with its top cover removed to show the heat sink assembly included therein.
Figure 3B:
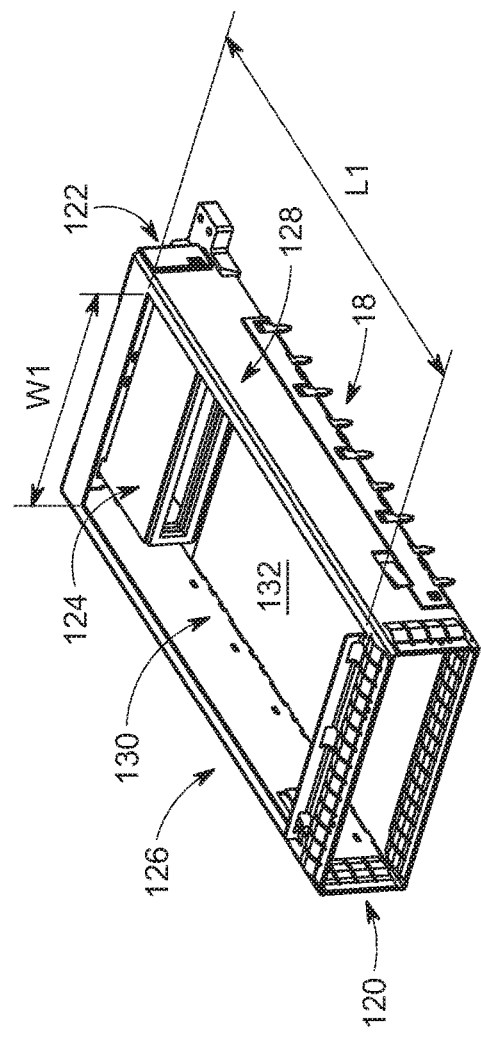
FIG. 3B illustrates a front perspective view of a module cage included in the computing apparatus of FIG. 3A, according to an example embodiment.
Figure 3C:
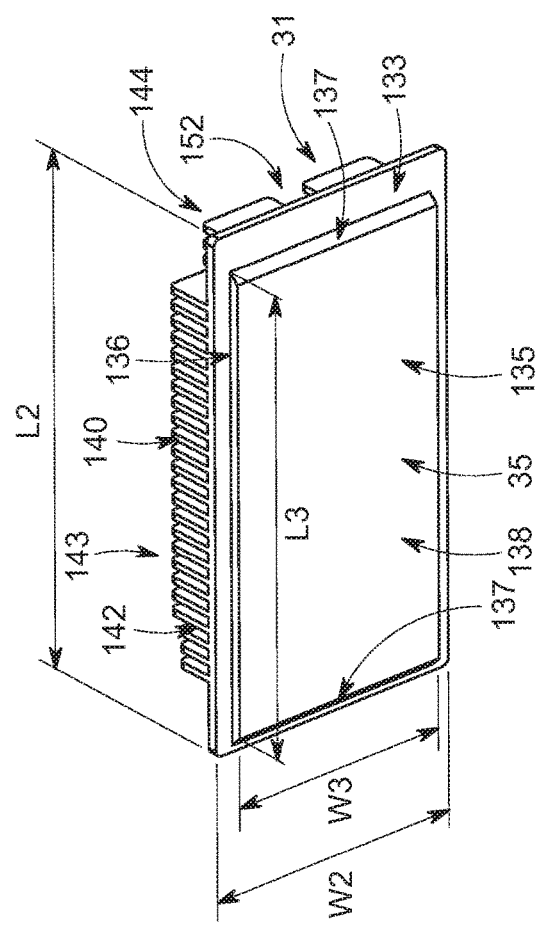
FIG. 3C illustrates a bottom perspective view of an example embodiment of a heat sink that may be included in the heat sink assembly of FIG. 3A, according to an example embodiment.

Now turning to FIGS. 3A, 3B, and 3C, these Figures illustrate portions of the apparatus 12 in further detail. In FIG. 3A, the apparatus 12 is shown with its top cover 104 removed. With the top cover 104 removed, the heat sink assembly 30 can be seen disposed above the module cage 18. Meanwhile, FIG. 3B illustrates the module cage 18 removed from the housing 14 and FIG. 3C illustrates a heat sink 31 of heat sink assembly 30 removed from the apparatus 12. As can be seen in FIG. 3B, the module cage 18 extends from an open front end 120 to a back end 122. The back end 122 includes a connector 124 that may connect a computing module 20 to an apparatus 12 in which the module cage 18 is included (e.g., via PCB 16). That is, the connector 124 may be configured to provide a Small Computer System Interface (SCSI) connection, Serial Attached SCSI (SAS) connection, an advanced technology attachment (ATA) connection, a Serial ATA (SATA) connection, and/or or any other type of connection for field replaceable computing modules.

Additionally, the module cage 18 extends from a first side 126 to a second side 128 and includes an open top 130. Collectively, the open front end 120, the back end 122, the first side 126, the second side 128, and the open top 130 define an internal chamber 132. That is, the open front end 120, the back end 122, the first side 126, the second side 128, and the open top 130 define a perimeter or periphery of chamber 132 (with sides 126 and 128 defining a lateral periphery while front end 120 and back end 122 defining a longitudinal periphery). The chamber 132 is sized to house/receive computing module 20 and the open top 130 allows the heat sink assembly 30 to access and engage the top surface 22 (i.e., the heat transfer surface) of a computing module 20 installed within a chamber 132.

In different embodiments, the open top 130 may provide access to the chamber 132 in any desirable manner, such as via one or more windows, cut-outs, segments, etc. However, in the depicted embodiment, the open top 130 spans the entire surface area of the chamber 132, extending a length L1 from the open front end 120 to the back end 122 (e.g., in a front-to-back or depth dimension) and a width W1 from the first side 126 to the second side 128 (e.g., in a lateral or width dimension). Thus, the depicted embodiment may maximize the area within which heat may transfer from the computing module 20 to the heat sink assembly 30.

In FIG. 3C, the heat sink 31 is shown from a bottom perspective view, which illustrates the TIM 35 that is included on a mating surface 133 of the heat sink 31. The TIM 35 includes a first surface 135 and a second surface 136. The second surface 136 is fixedly coupled to the mating surface 133 of the heat sink 31 (e.g., via adhesive, ultrasonic welding, etc.) and the first surface 135 is disposed opposite the second surface 136. Thus, the first surface 135 faces the open top 130 of the module cage 18 when the heat sink 31 is installed above the module cage 18. In at least some embodiments, the first surface 135 may include or be coated with a protective film that prevents the first surface 135 from sticking to a module 20. In the depicted embodiment, the first surface 135 and second surface 136 converge towards both a front 144 and a back 146 (see FIG. 5) of the heat sink 31 so that the second surface 135 includes convergent sections 137 and a flat section 138. However, in other embodiments, the first surface 135 and the second surface 136 need not converge and, for example, may be parallel to each other across the dimensions of the TIM 35.

Regardless of the shape of the TIM 35, the mating surface 133 of the heat sink 31 may have dimensions L2 (e.g., a front-to-back dimension) and W2 (e.g., a width) that are at least as large as the corresponding top dimensions (L1 and W1, respectively) of the chamber 132 (defined by the open top 130) and a heat receiving portion of the TIM 35 (e.g., the flat section 138) may span or cover a majority of the mating surface 133. More specifically, the TIM 35 may span (e.g., cover) at least a depth or front-to-back dimension L1 of the open top 130 (which defines a depth of a top of the chamber 132). Additionally or alternatively, the TIM 35 may span a lateral dimension L2 of the open top 130 (which defines a lateral dimension of a top of the chamber 132). For example, the flat section 138 of the TIM 35 may have a lateral dimension W3 (e.g., width W3) that is equal to or greater than W1 and/or the flat section 138 of the TIM 35 may have a front-to-back dimension L3 (e.g., depth L3) that is equal to or greater than L1. Consequently, the flat section 138 of the TIM 35 may cover as much of the computing module 20 as possible and maximize heat transfer between a computing module 20 and the heat sink 31.

Notably, with the heat sink assembly presented herein, the TIM 35 can span the entire surface area (e.g., L1 by W1) of the chamber 132 because, in at least some embodiments, the heat sink assembly 30 only moves the heat sink 31 vertically with respect to the module cage 18 (and a computing module 20 installed therein). If, instead, the heat sink 31 moved laterally or in a front-to-back direction, open space would need to be available to allow movement of heat sink 31. In some instances, this issue might be addressed by moving the heat sink 31 outside the peripheral boundaries of the module cage 18 (e.g., laterally beyond side 126 or 128). However, such movement would increase the dimensional footprint of the heat sink assembly 30, which is often undesirable, if not impossible, in high-density computing solutions.

Still referring to FIG. 3C, the mating surface 133 of the heat sink 31 forms a bottom of the heat sink 31 and fins 140 extend upwards therefrom. Specifically, the fins 140 and/or the mating surface 133 may include/define a base 142 and the fins 140 may extend from the base 142 to a top 143 of the heat sink 31. In the depicted embodiment, the fins 140 cover a majority of the base 142 between a front 144 and a back 146 of the heat sink 31 to maximize cooling and each of the fins 140 extends in a side-to-side direction across the heat sink 31. However, in other embodiments, the fins 140 may be arranged in any orientation or configuration. For example, the fin geometry, profile, and dimensions can be customized for different types of applications and airflow directions (e.g., front-to-back and/or side-to-side airflow). Still further, in yet other embodiments, heat sink 31 might be finless and may, for example, dissipate heat via heat pipes, fluid thermal management, or other mechanisms/arrangements that dissipate heat.

Figure 4:
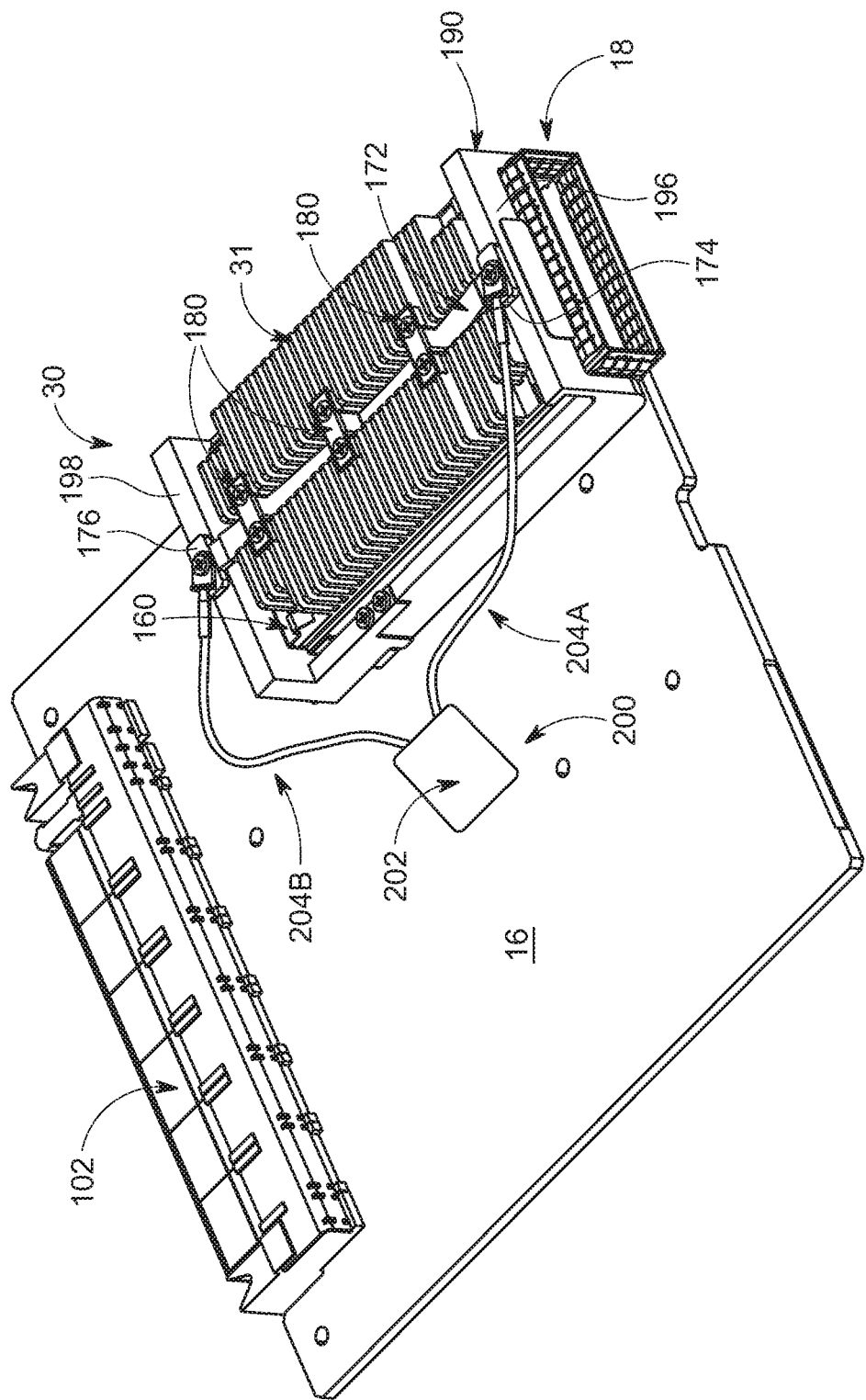
FIG. 4 illustrates a top, front perspective view of the heat sink assembly and module cage included in the computing apparatus of FIG. 3A.
Figure 5:
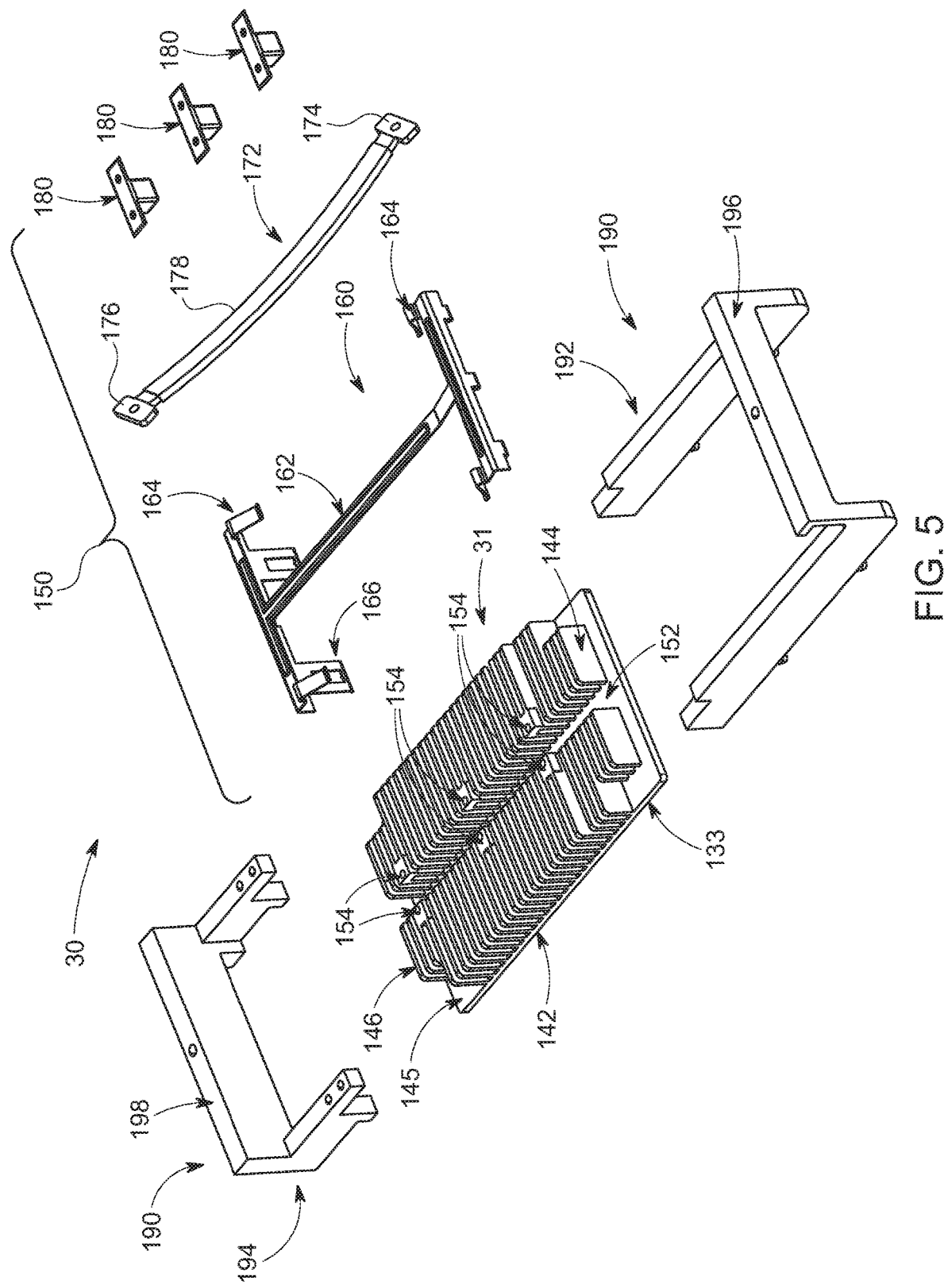
FIG. 5 illustrates an exploded view of the heat sink assembly included in the computing apparatus of FIG. 3A.

Now turning to FIGS. 4 and 5, the fins 140 may also define a number of openings, cavities, channels, mounting features, etc. to accommodate and secure portions of the heat sink assembly 30, such as an actuation assembly 150 of the heat sink assembly 30. In the depicted embodiment, the fins 140 define a passageway 152 that extends in a front-to-back direction through the heat sink 31 and also define three mounting points 154 spaced along top edges of the passageway 152 (i.e., at a top of sides of the passageway 152). The passageway 152 is an open-top passageway that is centered with respect to the fins 140, but in other embodiments, the passageway 152 could be a through hole, a partially covered passageway, or any other opening/passageway/cavity. Additionally or alternatively, in other embodiments, the passageway 152 need not be centered with respect to the fins 140 and/or could be one of a plurality of passageways. Moreover, although not shown, in some embodiments the fins 140 may define additional channels configured to accommodate other features or elements, such as longitudinal channels for guide pins that extend fully or partially through the fins 140. Still further, in some embodiments the fins 140 need not define any openings, cavities, channels, etc. For example, the actuation assembly 150 might extend along one or more sides of heat sink 31 (such an actuation assembly 150 might have a height that is low enough not to impair airflow through the heat sink 31).

Generally, and still referring to FIGS. 4 and 5, the heat sink 31 is positioned atop the cage 18, but is not directly connected to the module cage 18. Instead, the heat sink 31 is "floating" with respect to the module cage 18 and the actuation assembly 150 movably couples the heat sink 31 to the module cage 18. That is, the actuation assembly 150 included in the heat sink assembly 30 presented herein is configured to lift and lower the heat sink 31. In the embodiment of FIGS. 2A-5, the actuation assembly 150 includes a biasing member 160, a shape memory alloy (SMA) element 172, and closure brackets 180. Additionally, in the depicted embodiment, the heat sink assembly 30 includes a support frame 190 that helps couple the actuation assembly 150 to the module cage 18.

In the depicted embodiment, the biasing member 160 is connected the module cage 18 via connectors 166 and includes spring members 164 that are positioned above the base 142 of the heat sink 31. Specifically, the spring members 164 engage corners 145 of a top surface of the base 142 of the fins 140, which are left open by shortened fins 140 disposed at a front 144 and back 146 of the heat sink 31. The spring members 164 are connected together by support members 162 and, since the biasing member 160 is anchored to (i.e., fixedly coupled to) the module cage via connectors 166, the spring members 164 resist upwards movement of the heat sink 31. Thus, the spring members 164 exert a restorative force on the heat sink 31 in response to upwards movement of the heat sink 31. That is, due to the aforementioned features and connections, the biasing member 160 will consistently urge the heat sink 31 towards the module cage 18. However, biasing member 160 is only one example of an element, structure, and/or feature that may return the SMA element 172 to a rest or engaged position on or adjacent to the module cage 18 and, in other embodiments, SMA element 172 may be returned to its rest or engaged position in any desirable manner. In fact, other example techniques or elements are discussed in further detail below.

Meanwhile, the SMA element 172 includes a proximal end 174, a distal end 176, and an elongate section 178 extending between the proximal end 174 and the distal end 176. The elongate section 178 is positioned in the passageway 152 of the heat sink 31 and secured therein by closure brackets 180. To be clear, in this embodiment, the closure brackets 180 are not coupled to the SMA element 172; instead, the closure brackets 180 close the passageway 152 to capture the elongate section 178 therein. By contrast, the proximal end 174 and the distal end 176 of the SMA element 172 are fixed or anchored with respect to the module cage 18. Thus, elongate section 178 can flex or deform with respect to the proximal end 174 and the distal end 176 and act on (e.g., push) the closure brackets 180 and/or the heat sink 31 to move the heat sink 31 (which moves with the closure brackets 180) with respect to the module cage 18. In at least some embodiments, the elongate section 178 may be coated or covered with insulation, such as with a hot shrink tube, over molding, or any other technique, so that electric current does not leak between the SMA element 172 and the heat sink 31 (and/or closure brackets 180).

In the depicted embodiment, the closure brackets 180 are secured to the mounting points 154 of the heat sink 31 with fasteners, but in other embodiments, the closure brackets 180 can be secured to the fins 140 in any manner (e.g., welding, soldering, etc.). Additionally, in the depicted embodiment, the proximal end 174 and the distal end 176 of the SMA element 172 are secured to the module cage 18 via support frame 190, but in other embodiments the proximal end 174 and the distal end 176 of the SMA element 172 could be secured directly to the module cage 18 (e.g., the module cage 18 could include upwardly extending brackets that provide connection points).

That said, in the depicted embodiment, the support frame 190 includes a first frame portion 192 and a second frame portion 194 that are coupled together around the module cage 18. Additionally, the first frame portion 192 and the second frame portion 194 can be coupled to the PCB 16 and/or the module cage 18. Regardless, the first frame portion 192 includes or defines a first mounting portion 196 above the module cage 18 and the second frame portion 194 defines a second mounting portion 198 above the module cage 18. Mounting portions 196 and 198 are or include insulated or non-conductive portions that can insulate SMA element 172 from the module cage 18 and/or the remainder of heat sink assembly 30. Alternatively, the entire support frame 190 can be insulated or non-conductive. Either way, due to this insulation, current delivered to the SMA element 172 will not run into the heat sink 31, the module cage 18, and/or a module 20 installed in the module cage 18.

Figure 6:
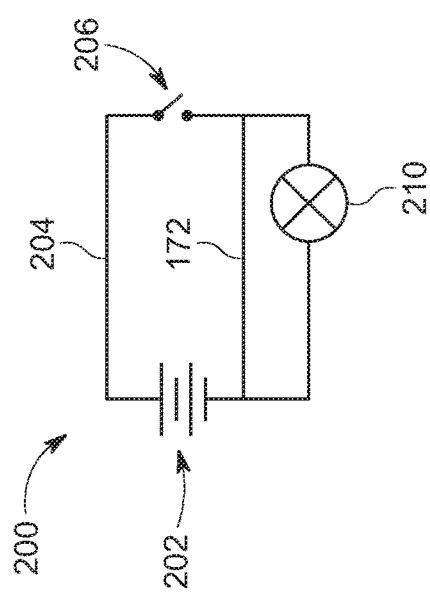
FIG. 6 is a diagram that schematically illustrates circuitry that may be included in the heat sink assembly of FIG. 3A, according to an example embodiment.

Now referring to FIGS. 4 and 6, generally, SMA actuates (e.g., deforms and/or contracts) in response to heating. Consequently, the SMA element 172 is included in or connected to circuitry 200 that can provide current to the SMA element 172 and cause resistive heating of the SMA element 172. For example, in FIG. 4, the proximal end 174 and the distal end 176 of SMA element 172 are coupled to positive and negative poles of a power source 202 via wires 204A and 204B (represented as wires 204 in FIG. 6) to form a circuitry 200 including the SMA element 172. The power source 202 can be a dedicated battery or any power source included in or connected to a computing solution in which the heat sink assembly 30 is installed. FIG. 6 illustrates this circuitry schematically in combination with additional electrical elements.

Specifically, in FIG. 6, the circuitry 200 includes a switch 206 that can be closed to deliver current to the SMA element 172. The switch 206 may be a mechanical switch actuated by a mechanical/physical actuator (e.g., a push button actuator) and/or an electrical/digital switch that is actuatable by a processor. Either way, closing the switch 206 may deliver current to the SMA element 172 that effectuates resistive heating of the SMA element 172 to cause an actuation of the SMA element 172 (e.g., a contraction or deformation). Additionally, in some embodiment, the circuitry 200 may include an indicator 210, such as a light, arranged in parallel with the SMA element 172. With such an arrangement, closing the switch 206 actuates the SMA element 172 and the indicator 210, for example, to provide an illuminated indication. However, this is just one example arrangement for an indicator and indicators could be arranged and operated in any manner now known or developed hereafter. For example, circuitry 200 could have any other configuration that allows indicator 210 to be activated in one or more colors. Additionally or alternatively, circuitry 200, or portions thereof, could be duplicated, to provide two or more indications (e.g., raised and lowered). Circuitry 200 may also include a constant-current feature that helps enable protracted actuation of SMA element 172 without exceeding thermal limits for the SMA material.

Figure 7:
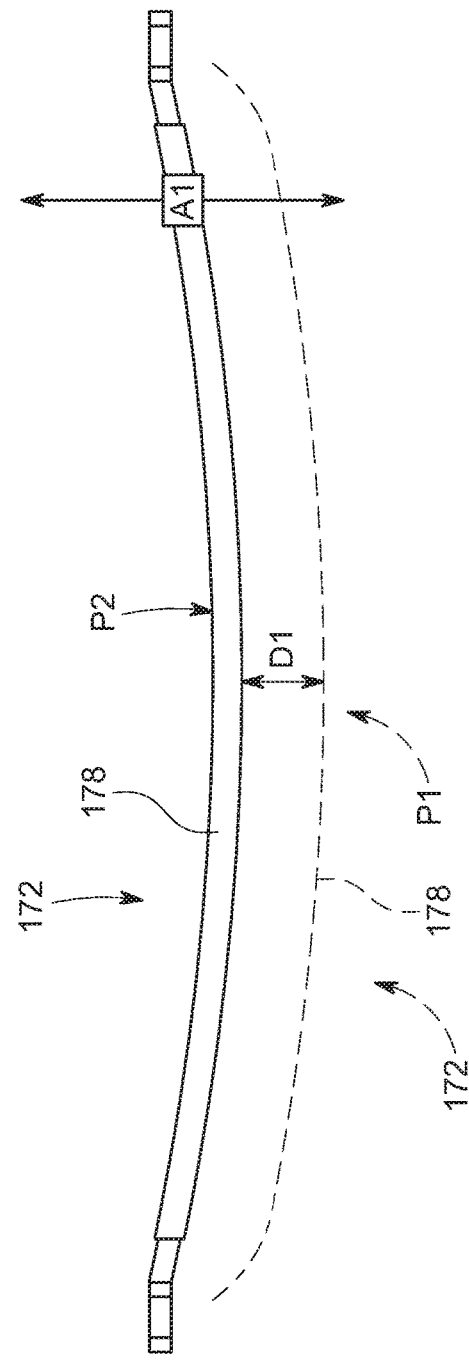
FIG. 7 is a side view of a shape memory alloy (SMA) element that may be included in the heat sink assembly of FIG. 3A, according to an example embodiment.

Now turning to FIG. 7, this Figure illustrates an actuation of SMA element 172. The initial or rest state or position P1 of the SMA element 172 is shown in dashed lines and the actuated state or position P2 is shown in solid lines. In this embodiment, SMA element 172 is a one-way SMA formed from any material that deforms when heated, including but not limited to copper-aluminum-nickel (Cu—Al—Ni), nickel-titanium (Ni—Ti), iron-manganese-silicon (Fe—Mn—Si), copper-zinc-aluminum (Cu—Zn—Al), and other alloys of zinc, copper, gold, and iron. Generally, the deformation behavior of a specific alloy can be modeled using hysteresis curves, which map material states of SMA as a function of temperature. Thus, specific alloy materials may be selected for SMA element 172 based on environmental characteristics of a computing solution in which the SMA element 172 is to be included and/or the current that will be delivered to the SMA element 172. For example, the SMA element 172 may be designed to actuate at a temperature that is significantly higher than a temperature of heat sink 31 during cooling operations to prevent heating of the heat sink 31 from causing an actuation of the SMA element 172.

Moreover, regardless of the specific composition of the SMA element 172, the SMA element 172 can be trained with thermomechanical treatments now known or developed hereafter so that the SMA element 172 deforms to specific shape when heated to a specific temperature (e.g., with resistive heating). For example, the SMA element 172 may be trained to move vertically between positions P1 and P2. Additionally or alternatively, the SMA element 172 may be trained to move along one degree of freedom (e.g., vertical, linear movement) and, thus, may restrict the heat sink assembly 30 to movement along one degree of freedom. Still further, the SMA element 172 can be trained to move in any direction and the heat sink assembly 30 might include additional features (e.g., guide pins) to control or restrict movement of the heat sink 31 (e.g., to one degree of freedom).

Still referring to FIG. 7, but now in combination with FIGS. 3A-6, regardless of how the SMA element 172 is trained or tuned, actuating the SMA element 172 presented herein may move the heat sink 31 vertically with respect to a module cage 18 (and, if installed, a computing module 20). For example, in the embodiment of FIGS. 2A-7, actuating the SMA element 172 may contract the SMA element 172 and cause the elongated section 178 to move upwards along vertical axis A1. Upwards movement of the elongated section 178 along vertical axis A1 pushes the closure brackets 180 upwards (see FIGS. 4 and 5) which may move the heat sink 31 upwards (along vertical axis A1) with respect to the module cage 18 (since the closure brackets 180 are fixedly secured to the heat sink 31). More specifically, upwards movement of the elongated section 178 along vertical axis A1 may move the heat sink 31 upwards a distance D1 upwards along axis A1, creating a gap G (see FIG. 1A) of, for example, 2-3 millimeters between the computing module 20 and the TIM 35. Notably, the proximal end 174 and the distal end 176 of the SMA element 172 remain fixed or anchored during deformation of the SMA element 172 and, thus, the elongate section 178 can drive vertical movement of the heat sink 31, which is essentially floating on the SMA element 172 (or at least on the elongate section 178 of the SMA element 172).

In the specific embodiment depicted in FIGS. 3A-7, the SMA element 172 is a one-way SMA and, thus, provides movement in one direction (when it's crystalline structure changes), but must be restored to its original or rest position (position P1) before it can provide another actuation. Thus, the biasing member 160 works in combination with the circuitry 200 to control movement of the heat sink 31. In particular, the circuitry 200 delivers a current to the SMA element 172 to cause a change to the crystalline structure of SMA element 172 that contracts the SMA element 172 to lift the heat sink 31 to its actuated position P2 (e.g., to provide a gap G as shown in FIG. 1A). Then, since the biasing member 160 is constantly exerting a restorative force on the heat sink 31, the biasing member 160 will return the SMA element 172 to its rest position P1 when current is no longer to the SMA element 172. This lowers the heat sink 31 into engagement with the module cage 18 and/or a module 20 installed within the module cage 18. Thus, to maintain the heat sink 31 in a raised position, current must be continually delivered to the SMA element 172. In fact, in at least some embodiment, the voltage is continuously adjusted (in any manner now known or developed hereafter) to maintain a constant current across the SMA element 172 when the heat sink 31 should be in a raised position (e.g., based on a user actuation and/or processor generated instructions).

Further, in at least some embodiments, the SMA element 172 may be trained, tuned, or controlled (e.g., controlled with current delivery) to provide non-constant vertical motion of the heat sink 31. This may be advantageous, for example, to provide an initially rapid downward motion of the heat sink, followed by a more gradual "seating" of TIM 35 onto the module 20. Alternatively, the tuning/training/controlling could provide a slow initial raising of the TIM 35 away from the module 20 to prevent the TIM 35 from being damaged when the TIM 35 is disconnected from the module 20. Additionally or alternatively, the configuration shown in FIGS. 3A-7 could be reversed and actuation of the SMA element 172 could compress the TIM 35 against a module 20. In such embodiments, the SMA element 172 can be trained to provide a specific compression of the TIM 35 to maximize heat transfer (e.g., tuned for a specific TIM material), either in combination with or independent of additional components (e.g., spring clips) that create compression. Example embodiments including such an arrangement are discussed in further detail below.

Overall, when the SMA element 172 is in its actuated position P2 (such that gap G is provided between the TIM 35 and the module cage 18), a computing module 20 can be installed or removed from the module cage 18. In at least some embodiments, the gap G may be consistent across the surface area of the TIM 35 (e.g., an area defined by W3 and L3), such that the TIM 35 (or at least a portion thereof) is parallel to the module cage 18 and/or the computing module 20 (i.e., the heat sink assembly 30 may provide uniform lifting). In any case, after a computing module 20 is installed in module cage 18 (which may be detected, for example, in the manner discussed below in connection with FIG. 9), the SMA element 172 may be moved to its rest position P1 (e.g., by opening switch 206 or otherwise stopping the flow of current to SMA element 172), which may move the TIM 35 into engagement with a heat transfer surface of the computing module 20 (e.g., top surface 22). In fact, in some embodiments, moving the SMA element 172 to its rest position P1 may compress the TIM 35 against the heat transfer surface of the computing module 20 (e.g., top surface 22), further encouraging heat transfer.

Now turning to FIG. 8-15B, these Figures depict additional embodiments of the heat sink assembly presented herein, or at least of portions thereof. In these Figures, components that are similar to components shown in FIGS. 2A-7 are labeled with like reference numerals and, any description of like reference numerals included above should be understood to apply to like components included in FIGS. 8-15B. Thus, for brevity, the foregoing description focuses on differences between the embodiments. Additionally, if components of FIGS. 2A-7 are not shown in embodiments depicted in FIGS. 8-15B, these embodiments may nevertheless be described with reference to components of FIGS. 2A-7 to provide clarity and/or context.

Figure 8:
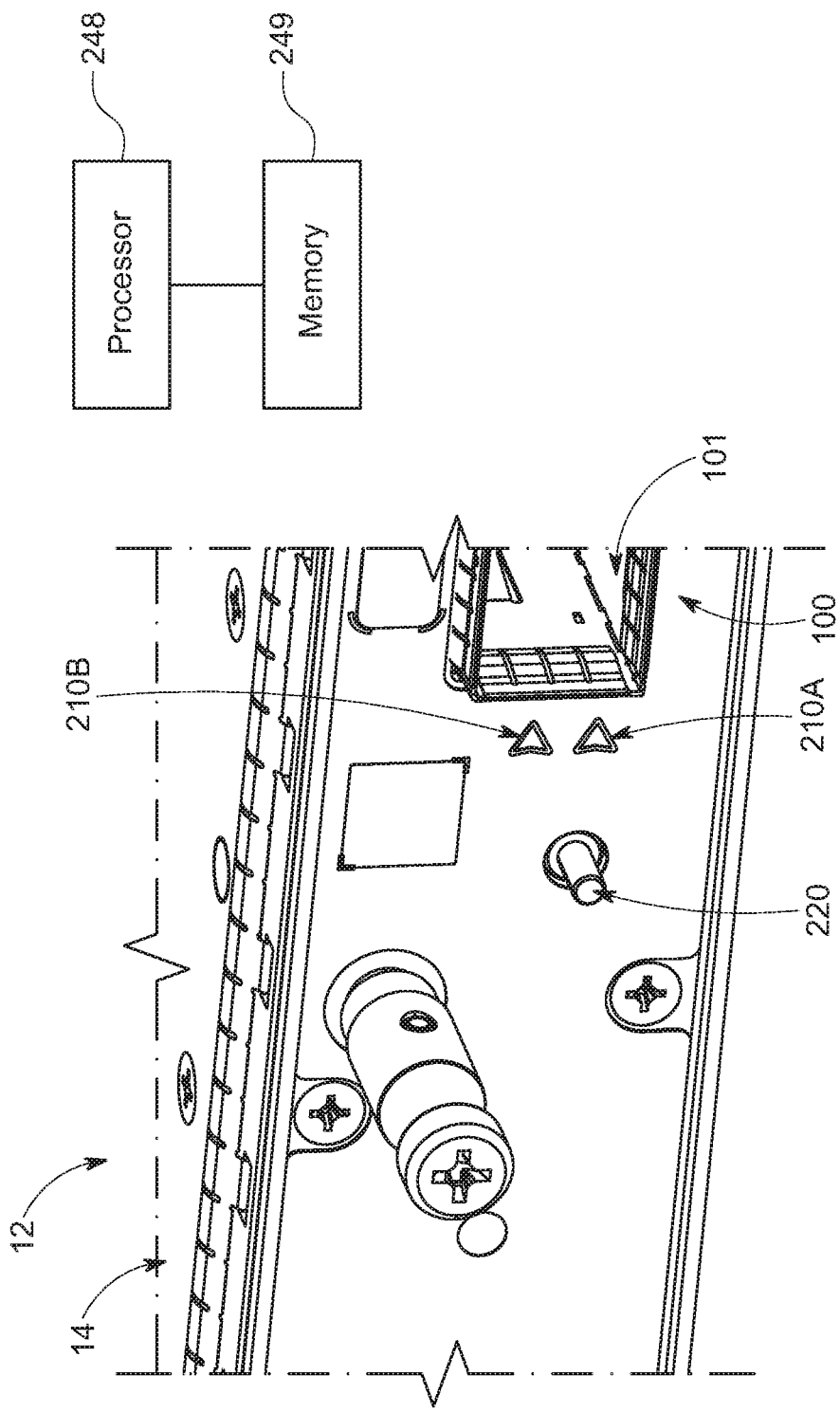
FIG. 8 illustrates a front perspective view of a portion of an exterior of the computing apparatus of FIG. 3A, according to an example embodiment.
Figure 9:
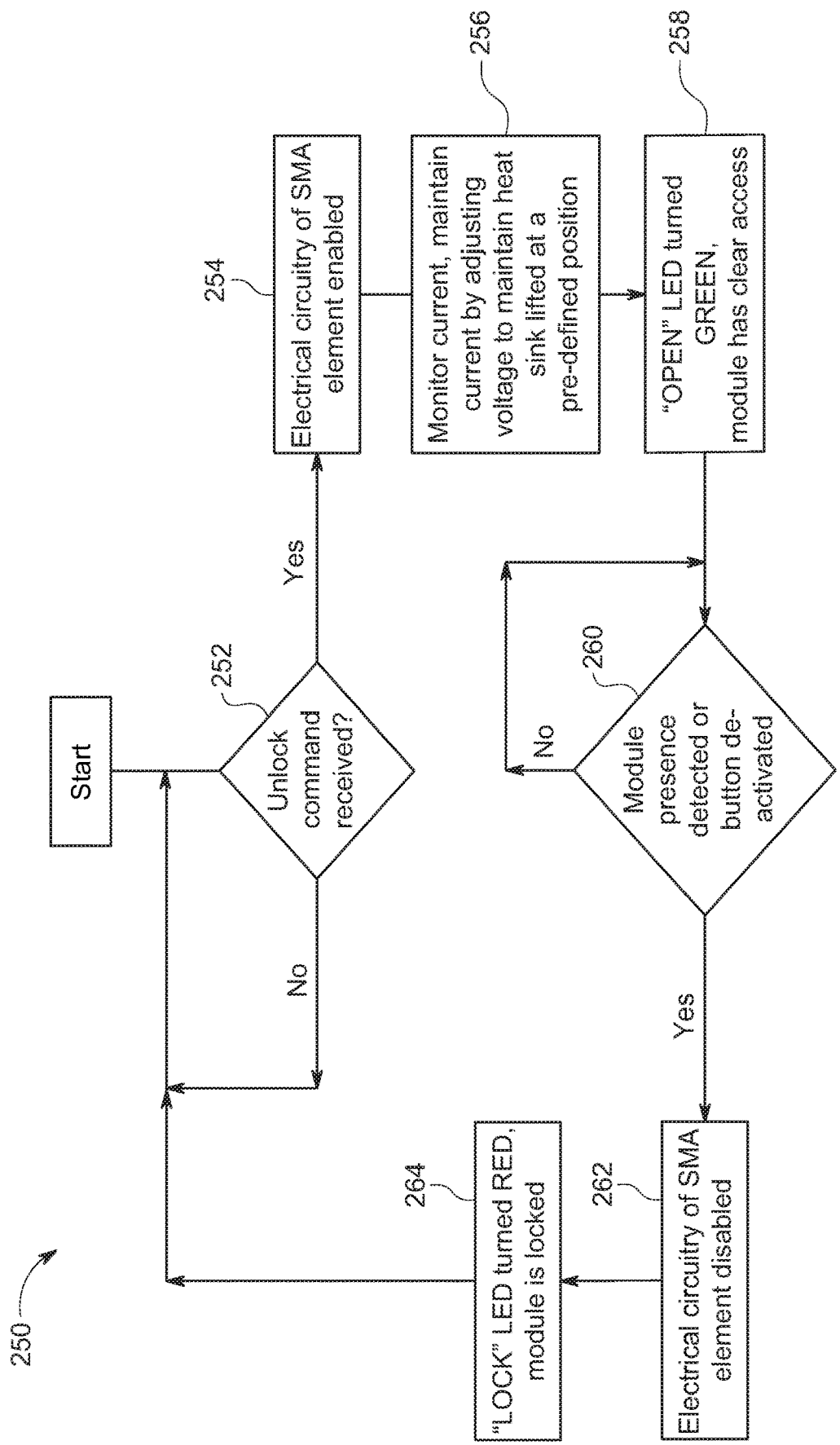
FIG. 9 is a flow chart depicting a method for operating components of an example embodiment of a heat sink assembly of the present application.

That said, FIGS. 8 and 9 depict a heat sink assembly 30 that can be actuated in response to a physical/mechanical actuator. FIG. 8 illustrates an example actuator 220 that may be included on a front panel 100 of computing apparatus 12 in combination with example indicators 210A and 210B. Notably, since FIG. 8 depicts two indicators 210A and 210B, the circuitry of this embodiment may be modified as compared to the circuitry 200 shown in FIG. 6. FIG. 9 illustrates a method 250 of operating indicators 210A and 210B. As is described in detail below, indicators 210A and 210B may be operated based on actuations of actuator 220 and/or electrical actuations (e.g., based on commands generated by a processor). That is, with this arrangement, processing logic may control operations of indicator 210A, indicator 210B, and/or SMA element 172, either in combination with actuations of actuator 220 or independent of actuations of actuator 220. In fact, in some embodiments, the computing solution need not include an actuator and a processor 248 could execute instructions stored in memory 249 to control indicator 210A, indicator 210B, and/or SMA element 172 (or any other arrangement of indicators and SMA elements) with purely electrical operations.

In FIG. 9, method 250 illustrates operations that processor 248, which may comprise any processor included in the computing solution of FIG. 8 may execute to control indicator 210A, indicator 210B, and/or SMA element 172 (or any other arrangement of indicators and SMA elements). Generally, the processor 248 may comprise one or more processing cores and the memory 249 may comprise at least one non-transitory computer readable medium or memory for holding instructions programmed according to the embodiments presented, for containing data structures, tables, records, etc. Instructions stores in memory 249 may include software code scripts, etc. for controlling indicators and/or the SMA element 172. In any case, initially, at 252, the processor 248 determines if an unlock command has been received. In some instances, the unlock command can be the actuation of actuator 220. Alternatively, an unlock command could be a command input or generated via a graphical user interface or other computing interface connected to processor 248. In response to such a command, electrical circuitry of the SMA element 172 is enabled. That is, current is delivered to SMA element 172 (e.g., by power source 202). This actuates (e.g., deforms/contracts) the SMA element 172 and lifts the heat sink 31 in the manner described above.

Then, at 256, the processor monitors the current and maintains a constant current across the SMA element 172 by adjusting the voltage, as was discussed above. During operations 254 and/or 256, the processor 248 can activate indicator 210B, for example, to provide a green light indication that the module cage 18 is "OPEN," as is shown at 258. Additionally or alternatively, as mentioned above, an actuation of actuator 220 might close a switch that activates indicator 210B or allows processor 248 to activate indicator 210B.

Once the module cage is "OPEN," the processor 248 may, at 260, monitor for presence of a module 20 in the module cage 18. That is, once the heat sink 31 is in a raised position, the processor 248 may monitor for presence of a module 20 in the module cage 18 at 260. For example, the module cage 18 may include an interrupt at or adjacent its back end 122 that provides a signal when a module 20 is fully installed in the module cage 18. Additionally or alternatively, the processor 248 can monitor connector 124 to sense when the connector 25 of the module 20 has been fully inserted into the module cage 18 and connected with connector 124. Still further, in some embodiments, a user might be able to actuate the actuator 220 a second time to indicate that a module 20 has been fully installed in the module cage 18. Regardless, the processor 248 may ensure that the SMA element 172 stays activated (maintaining the heat sink 31 in a raised position) until the module 20 is detected as being installed in the module cage 18. That is, the processor 248 may cause the power source 202 to continue delivering power to SMA element 172 (with continued instructions or by withholding a command to cut off power) until a module 20 is determined to be fully installed in module cage 18.

When processor 248 determines that a module 20 is fully installed in the module cage 18, the processor 248 may, at 262, disable electrical circuitry of the SMA element 172. That is, the processor 248 may disconnect power from the SMA element 172 to discontinue the delivery of current to SMA element 172 (e.g., by providing instructions to power source 202). This may deactivate the SMA element 172 and allow biasing member 160 to move the heat sink 31 into contact with the module 20 and/or the module cage 18.

Additionally, indicator 210A can be activated (while indicator 210B is deactivated), for example, to provide a red light indication that the module cage 18 is "LOCKED," as is shown at 264. The heat sink assembly 30 may then remain in a locked position until a new unlock command is received at 252.

Figure 10A:
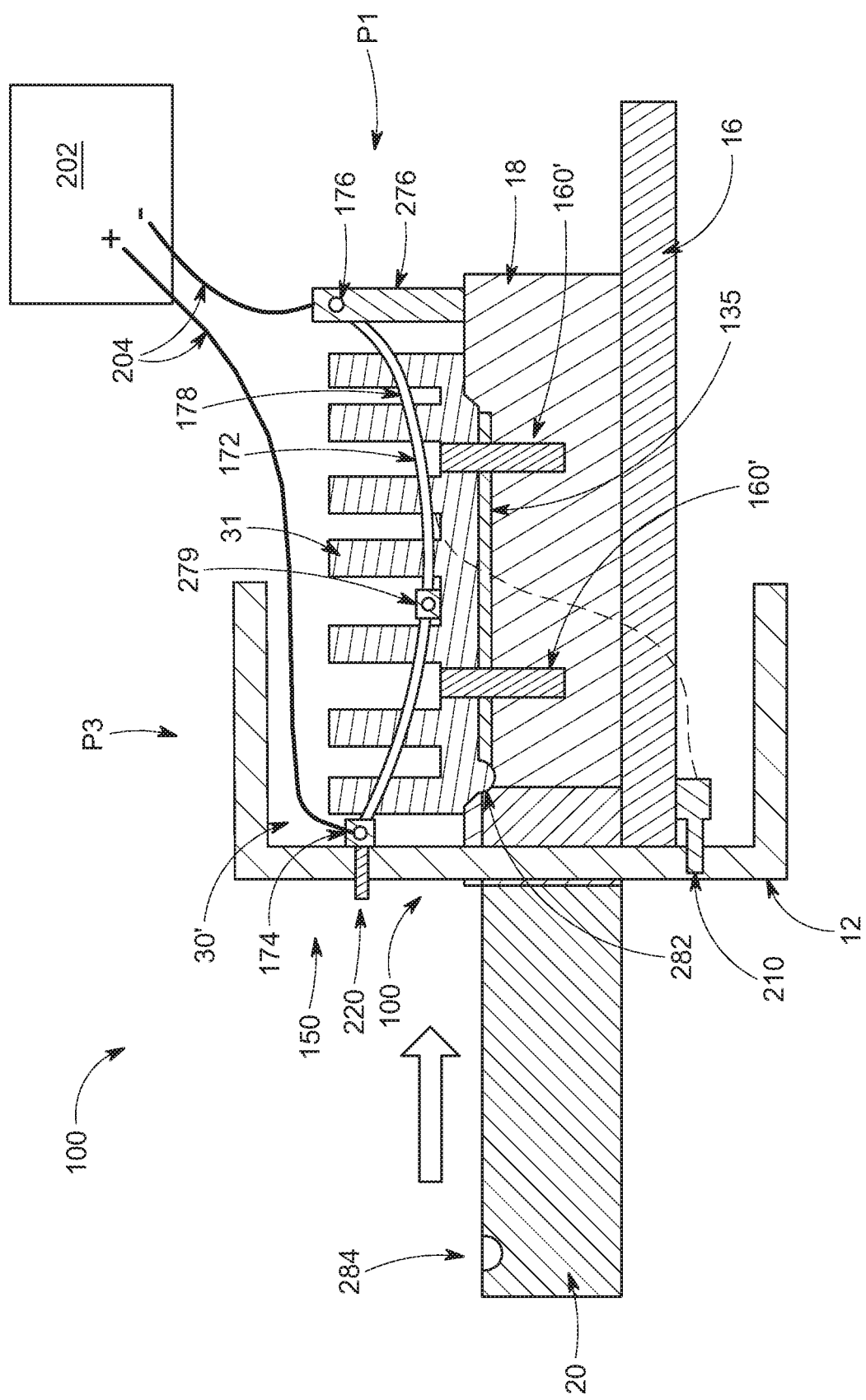
FIG. 10A illustrates a schematic side view of another example embodiment of a heat sink assembly, the heat sink assembly being in a lowered position.
Figure 10B:
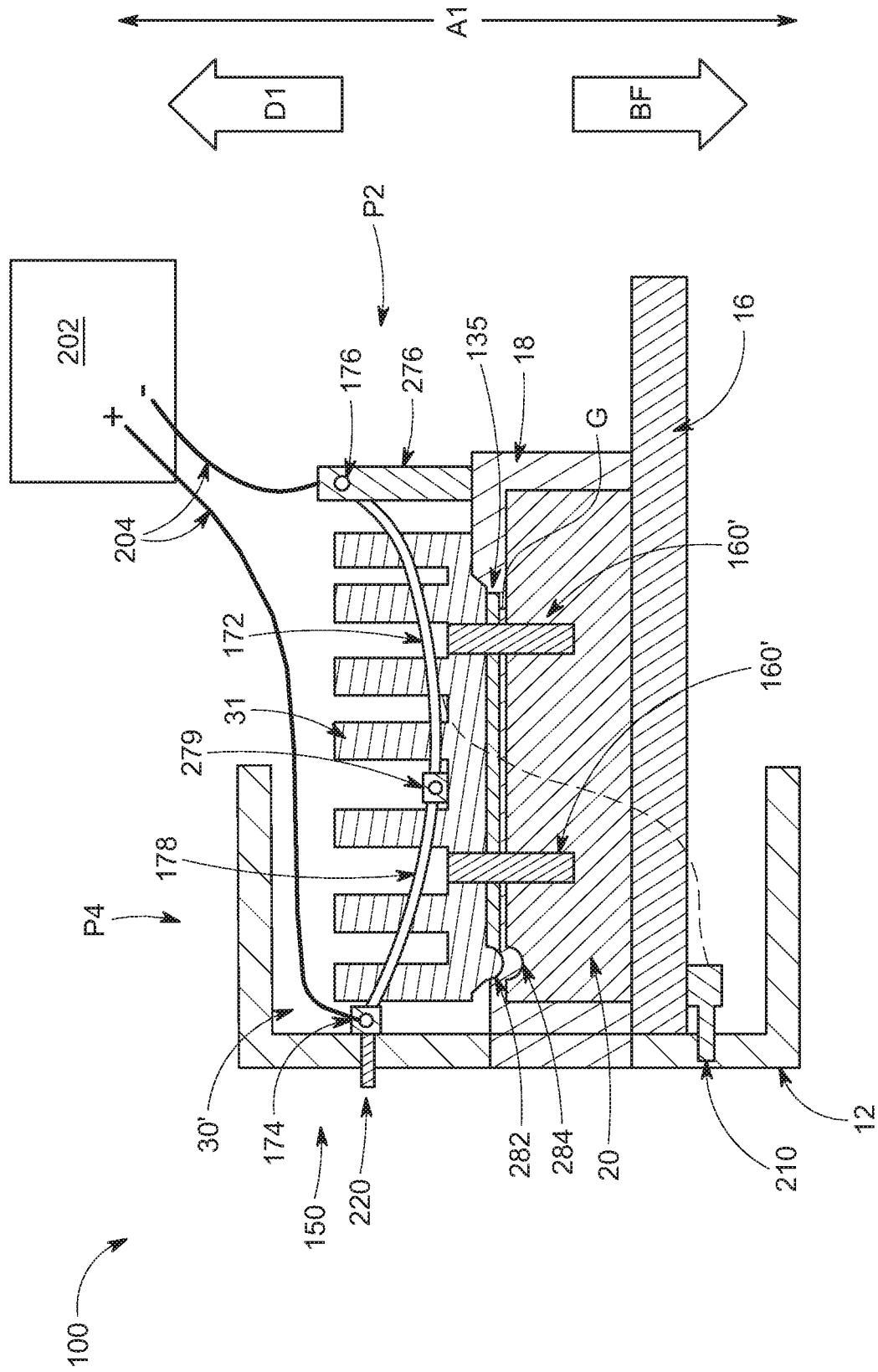
FIG. 10B illustrates a schematic side view of the heat sink assembly of FIG. 10A while in a raised position, according to an example embodiment.

Next, FIGS. 10A and 10B illustrate another example embodiment of a heat sink assembly 30' presented herein. Heat sink assembly 30' is substantially similar to the heat sink assembly 30 shown in at least FIG. 3A. Thus, to reiterate, like reference numerals are used to denote similar parts and, for brevity, the foregoing description focuses on differences between the embodiments. Most notably, in this embodiment, the heat sink assembly 30' does not include a support frame. Instead, the proximal end 174 of the SMA element is connected to the front panel 100 of the apparatus 12 and the distal end 176 is connected to a bracket 276 extending from the module cage 18. Moreover, the SMA element 172 is not secured within the heat sink 31 by covers, such as closure brackets 180 and, instead, is directly connected to heat sink 31 via one or more insulated couplings 279. Still further, heat sink assembly 30' does not include a biasing member 160 in the form of a spring clip, but instead, includes compression springs 160' that exert a constant restorative or biasing force BF (see FIG. 10B) on the heat sink 31 and SMA element 172 (like biasing member 160).

Despite the differences between heat sink assembly 30 and heat sink assembly 30', heat sink assembly 30' still operates in a substantially similar manner to heat sink assembly 30. That is, SMA element 172 is still a one-way SMA that contracts to an actuated position P2 and lifts the heat sink along axis A1 a distance D1 to a raised position P4 (see FIG. 10B) in response to resistive heating. This creates a gap G that allows a module 20 to be inserted or removed from cage 20 without damaging TIM 35. Then, when power to the SMA element 172 is turned off, the biasing force BF of compression springs 160' returns the SMA element 172 to its rest position P1 while lowering the heat sink 31 into a lowered position P3 where it can compress TIM 35 against a module 20 (see FIG. 10A). Additionally, like previously described embodiments, heat sink assembly 30' includes an actuator 220 and indicator 210 that can actuate the heat sink assembly 30' and provide indications of how the heat sink 31 is positioned, respectively.

Figure 11B:
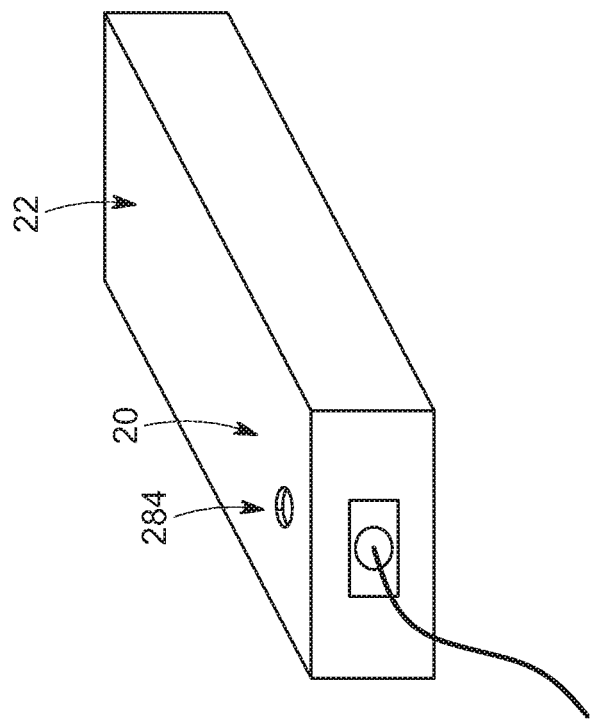
FIGS. 11A and 11B illustrate perspective views of a heat sink and a field replaceable computing module, respectively, with which the heat sink assembly presented herein may be utilized, according to another example embodiment.
Figure 11A:
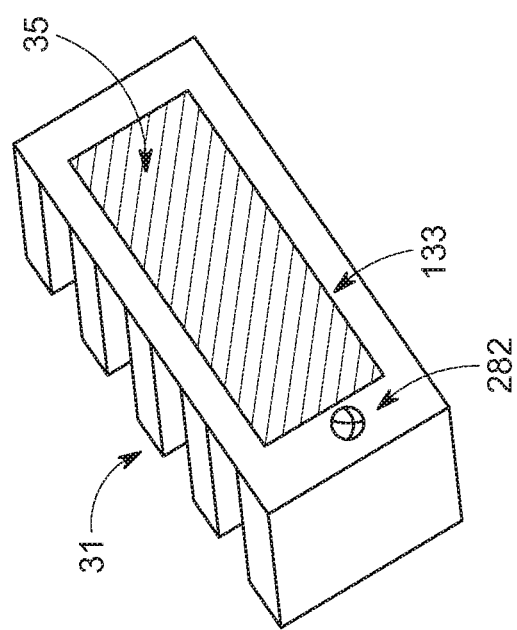

Still referring to FIGS. 10A and 10B, but now with reference to FIGS. 11A and 11B as well, in this embodiment, the heat sink assembly 30' also includes a locking feature that can prevent insertion or removal of the module 20 when the heat sink assembly 30' is in its lowered position P3. Specifically, in this embodiment, the heat sink assembly 30' includes a protrusion 282 positioned forwardly of the TIM 35 on the mating surface 133 of the heat sink 31 (e.g., closer to the open front end 120 of the module cage 18), as is shown clearly in FIG. 11A. With this embodiment, and as is shown in FIG. 11B, the computing module 20 includes a corresponding receptacle 284 configured to mate with the protrusion 282 when the computing module 20 is fully installed into a module cage 18. Thus, when the heat sink assembly 30' moves the TIM 35 into engagement with the top surface 22 of the computing module 20, the protrusion 282 will engage the receptacle 284 and resist movement in the front-to-back direction. Then, if the computing module 20 is pulled outwardly prior to the heat sink assembly 30 moving the TIM 35 out of engagement with the top surface 22 of the computing module 20, the protrusion 282 and the receptacle 284 may resist this movement and prevent damage to the TIM 35 that can occur when the module 20 slides along the TIM 35. This arrangement will also ensure that module 20 is not forcefully inserted or extracted which could cause an unintentional damage for the TIM 35 (insertion prevention is illustrated in FIG. 10A).

Figure 12:
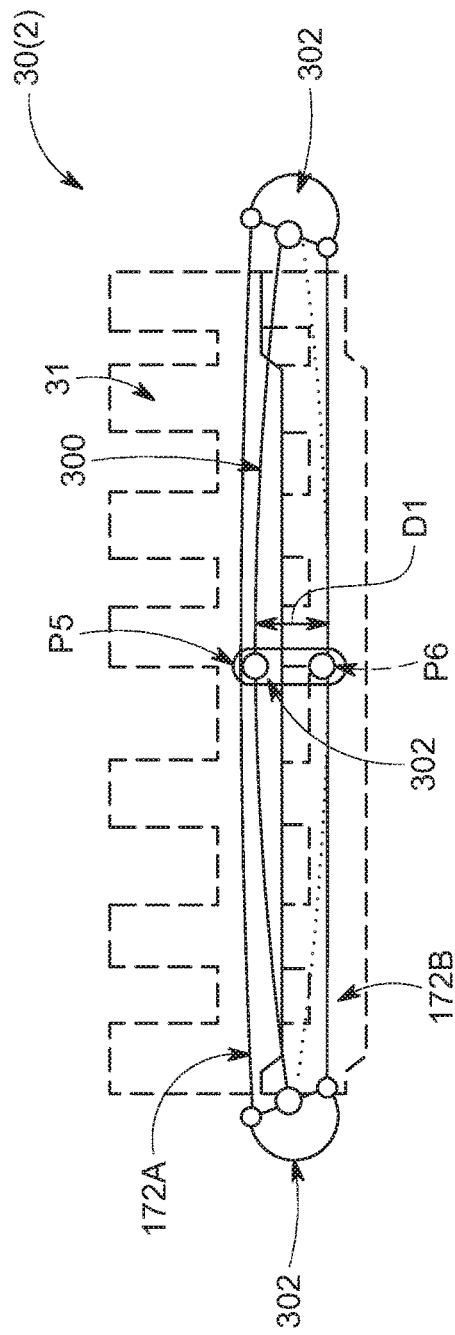
FIG. 12 illustrates a schematic side view of another example embodiment of the heat sink assembly presented herein.

Next, FIGS. 12, 13, 14A, and 14B illustrate yet further example embodiments of the heat sink assembly presented herein that can operate without a biasing member exerting a constant restorative force on the heat sink 31. First, FIG. 12 provides a heat sink assembly 30(2) with a bi-stable toggle element 300 disposed between two one-way SMA elements: SMA element 172A and SMA element 172B. When current is delivered to one of SMA element 172A and SMA element 172B, that SMA element may deform (e.g., contract) and move the bi-stable toggle element 300 to a first position. Then, when current is delivered to the other of SMA element 172A and SMA element 172B, that SMA element may deform (e.g., contract) and move the bi-stable toggle element 300 to a second position. Alternatively, SMA element 172A and SMA element 172B may have different compositions and/or characteristics (e.g., different "training" or "tuning") that cause the different SMA elements to respond (e.g., deform or actuate) to different magnitudes of currents (and, thus, might be actuated by precisely controlling the current delivered to both SMA elements). Regardless, with this arrangement, actuation of one of SMA element 172A and SMA element 172B drives the bi-stable toggle element 300 to a specific position and then the bi-stable toggle element 300 holds or locks the heat sink 31 in that position. Consequently, current need not be constantly delivered to SMA element 172A or SMA element 172B to hold (e.g., lock) the heat sink assembly 30(2) in a specific position (e.g., a raised or lowered position).

More specifically, in the depicted embodiment, delivering current to SMA element 172B may contract SMA element 172B, pivoting a bottom end of pivot points 302 inwards and moving (e.g., snapping) the bi-stable toggle element 300 to position P5 (shown in solid lines). Pivoting pivot points 302 will also stretch or elongate SMA element 172A (i.e., return SMA element 172A to its rest position) so that SMA element 172A is ready to actuate (e.g., contract) in response to receiving current. In the depicted embodiment, bi-stable toggle element 300 is coupled to heat sink 31 at pivot point 302. Thus, moving the bi-stable toggle element 300 to position P5 moves the heat sink upwards a distance D1. However, in other embodiments, the bi-stable toggle element 300 may be directly coupled to and/or enclosed within the heat sink 31 in any manner. Regardless, once the bi-stable toggle element 300 is in position P5, current need not be delivered to SMA element 172B, as the bi-stable toggle element 300 will maintain (e.g., lock) the heat sink 31 in a raised position.

Then, to lower the heat sink 31, current is delivered to SMA element 172A to actuate (e.g., contract) SMA element 172A and pivot top ends of pivot points 302 inwards. This moves (e.g., snaps) the bi-stable toggle element 300 to position P6 (shown in dashed lines) and moves the heat sink downwards a distance D1. Again, once the bi-stable toggle element 300 is in position P6, current need not be delivered to SMA element 172A, as the bi-stable toggle element 300 will maintain (e.g., lock) the heat sink 31 in a lowered position.

Figure 13:
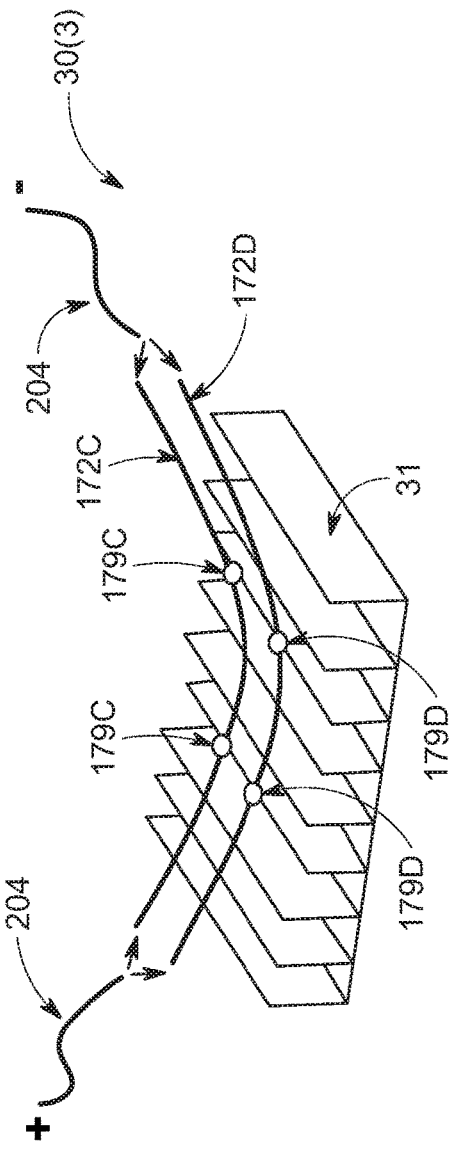
FIG. 13 illustrates a top perspective view of still another example embodiment of the heat sink assembly presented herein

FIG. 13 illustrates another example embodiment of a heat sink assembly that can operate without a biasing member exerting a constant restorative force on the heat sink 31. Heat sink assembly 30(3) includes two SMA elements, like heat sink assembly 30(2) of FIG. 12, but provides a first SMA element 172C trained to deform to a shape that raises the heat sink 31 and a second SMA element 172D trained to deform to a shape that lowers the heat sink 31. For example, SMA element 172C may be trained and/or arranged so that actuation of SMA element 172C arcs or bends SMA element 172C upwards. SMA element 172C is connected to heat sink 31 at connection points 179C and, thus, upward bending or arcing of SMA element 172C moves heat sink 31 upwards. Meanwhile, SMA element 172D may be trained and/or arranged so that actuation of SMA element 172D arcs or bends SMA element 172D downwards. SMA element 172D is connected to heat sink 31 at connection points 179D and, thus, downward bending or arcing of SMA element 172D moves heat sink 31 downwards. However, SMA elements 172C and 172D are only shown directly attached to heat sink 31 as an example and SMA elements 172C and 172D could be coupled to heat sink 31 in any manner provided that actuation (e.g., contraction) of SMA element 172C or 172D moves the heat sink 31 up or down.

Figure 14A:
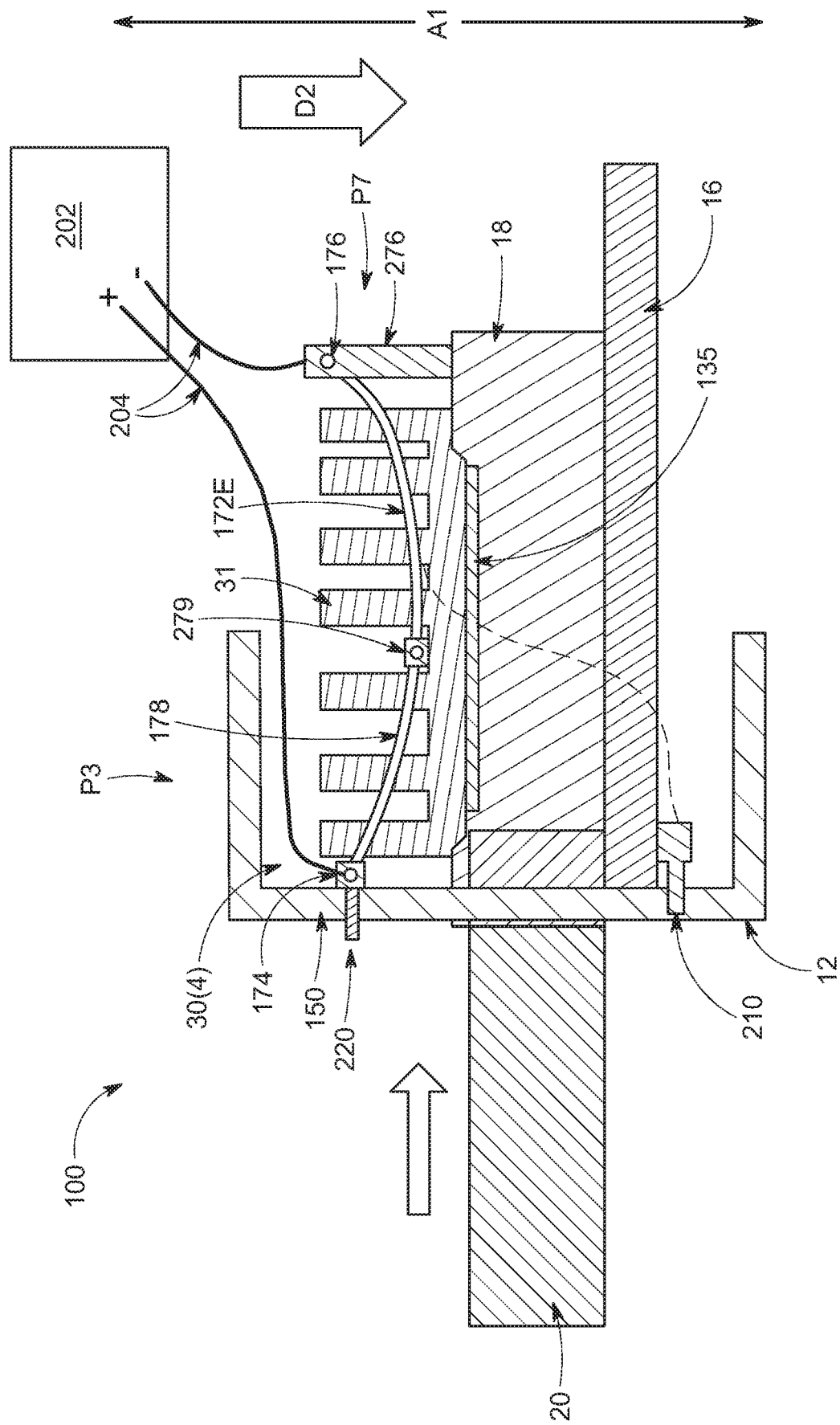
FIGS. 14A and 14B illustrate schematic side views of yet another example embodiment of a heat sink assembly that may be included in the computing solution of FIG. 2, the heat sink assembly being illustrated in a lowered position in FIG. 14A and a raised position in FIG. 14B.
Figure 14B:
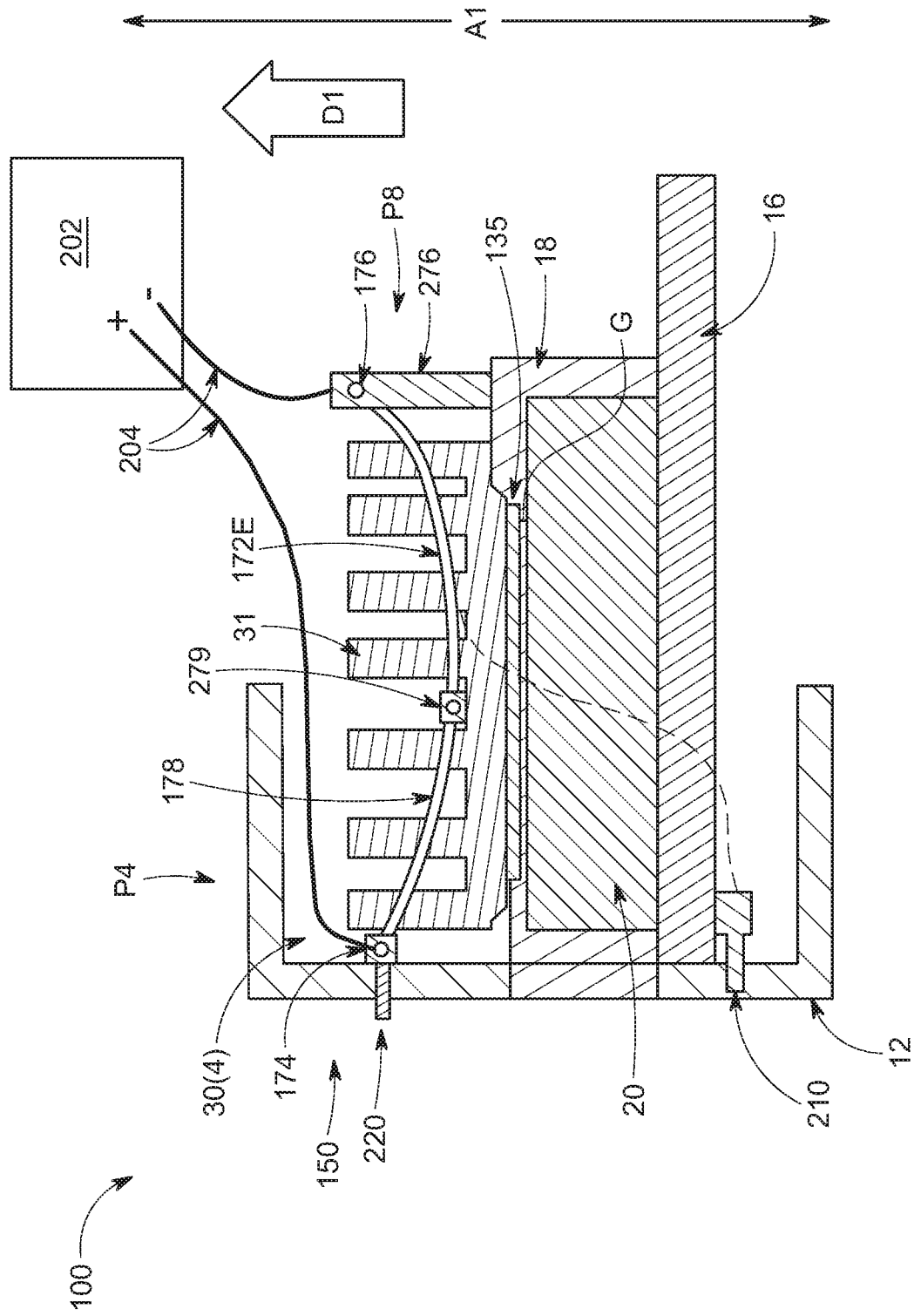

Now turning to FIGS. 14A and 14B, these Figures depict yet another example embodiment of a heat sink assembly that can operate without a biasing member exerting a constant restorative force on the heat sink 31. Heat sink assembly 30(4) is substantially similar to the heat sink assembly 30' shown in FIGS. 10A and 10B; however, now the heat sink assembly 30(4) does not include compression springs 160' or any kind of biasing member 160. Instead, SMA element 172E is a two-way SMA element. Thus, in response to a first current being delivered to a first portion of the SMA element 172E, the SMA element 172E may lift heat sink 31 a distance D1 along a vertical axis A1 to a raised position P4 (see FIG. 14B). Then, in response to a current being delivered to a second portion of the SMA element 172E, the SMA element 172E may lower heat sink 31 a distance D2 (which may be equal to distance D1) along a vertical axis A1 to a lowered position P3 (see FIG. 14A). Alternatively, different magnitudes of current might cause SMA 172E to raise and lower. Regardless, the arrangement shown in FIGS. 14A and 14B is similar to the arrangement of heat sink assembly 30(3) of FIG. 13, but now the functionality of SMA elements 172C and 172D from FIG. 13 is achieved by a single SMA element 172E.

Notably, with this embodiment, the currents that actuate SMA element 172E may move the SMA element 172E between a first actuated position P7 (corresponding to lowered positon P3 of heat sink 31) and a second actuated position P8 (corresponding to raised positon P4 of heat sink 31). However, since a restorative force (e.g., a biasing force) is not constantly acting on the heat sink 31 of heat sink assembly 30(4), SMA element 172E need not receive a constant current to stay in positions P7 and P8. Instead, current can be delivered to SMA element 172E to move the SMA element 172E between positions P7 and P8 and can be turned off after an actuation (like the embodiments shown and described in connection with FIGS. 12 and 13).

Figure 15A:
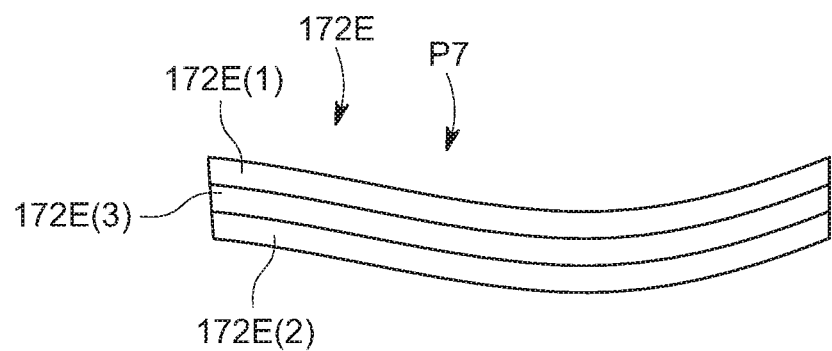
FIGS. 15A and 15B are side views of a shape memory alloy (SMA) element that may be included in the heat sink assembly of FIGS. 14A and 14B, according to an example embodiment.
Figure 15B:
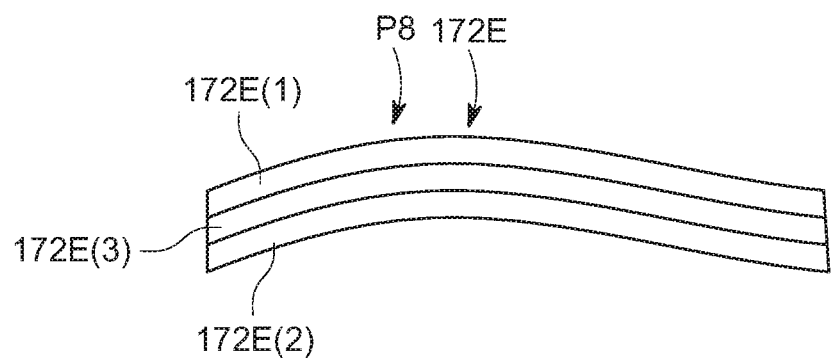

Now turning to FIGS. 15A and 15B, but with continued reference to FIGS. 14A and 14B, generally, two-way SMA toggles between two different shapes or "conformations." To achieve this, SMA element 172E includes two opposing SMA layers or SMA wires 172E(1) and 172E(2) that are joined and separated by a flexible and heat resistant material 172E(3). The SMA wires 172E(1) and 172E(2) and the heat resistant material 172E(3) extend longitudinally along a length of SMA element 172E and may be contained within an outer casing (giving SMA element 172E the appearance of a single wire). The first SMA layer/wire 172E(1) and the second SMA layer/wire 172E(2) are each trained or programmed to attain a specific shape when heated. That is, SMA layers/wires 172E(1) and 172E(2) may each be or function like one-way SMAs and, thus, any description of one-way SMAs included herein (e.g., relating to composition or training) should be understood to apply to SMA layers/wires 172E(1) and 172E(2). Consequently, to actuate SMA element 172E, current may be applied independently and sequentially to SMA layer/wire 172E(1) and 172E(2) to toggle the configuration of SMA element 172E between two configurations or states. Additionally or alternatively, first SMA layer/wire 172E(1) and the second SMA layer/wire 172E(2) may have different compositions that respond to different currents. FIG. 15A illustrates (in an exaggerated fashion) contraction of first SMA layer/wire 172E(1) driving SMA element 172E to its first actuated position P7 and FIG. 15B illustrates (in an exaggerated fashion) contraction of second SMA layer/wire 172E(2) driving SMA element 172E to its second actuated position P8.

Figure 16:
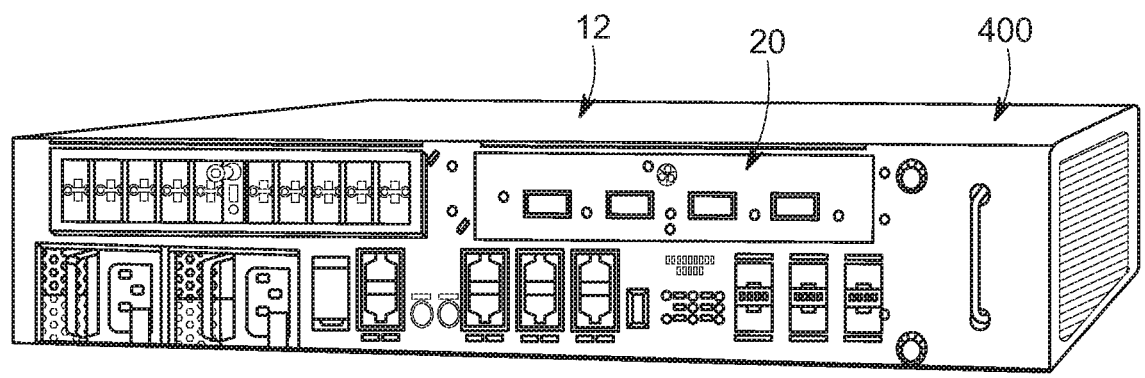
FIGS. 16 and 17 illustrate front perspective views of example embodiments of computing solutions and computing modules with which the heat sink assembly presented herein may be utilized.
Figure 17:
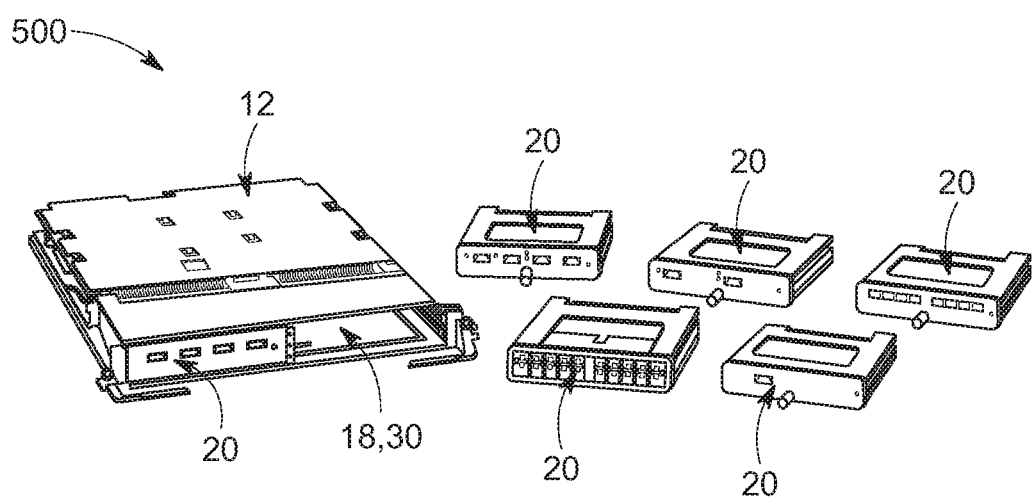

Now turning to FIGS. 16 and 17, these Figures illustrate example solutions that can utilize the heat sink assembly 30 presented herein. First, in FIG. 16, system 400 is a server or switch assembled in an apparatus 12 that is a pizza-box style chassis. The apparatus 12 includes a cage to receive a module 20 in the form of a modular port adapter (MPA). This provides flexibility for customer-based specializations and the heat sink assembly 30 presented herein can provide cooling for any MPA. Second, FIG. 17 illustrates a solution 500 with an apparatus 12 in the form of an MPA that can support computing modules 20 in the form of CFP2 optical transceivers. In this instance, the heat sink assembly 30 can be installed in the MPA to provide cooling for the CFP2 optical transceivers. Then, if the MPA was installed in, for example, a line card, the line card might also include a heat sink assembly 30 formed accordance with the embodiments presented herein to cool the MPA within the line card.

Among other advantages, the heat sink assembly presented herein may improve cooling of computing modules while minimizing a footprint of cooling components (at least because a heat sink may cover an entire computing module without moving beyond a lateral periphery of a computing module). In fact, in at least some embodiments, the heat sink assembly presented herein may completely eliminate the need for an actuator and leave the front panel unobstructed with any actuators. These embodiments may utilize a purely electrical actuation of the heat sink assembly. Alternatively, the heat sink assembly may provide a small button that requires only a push actuation and, thus a computing solution need not be installed or manufactured in a manner that provides space to accommodate linear or rotational movement of a user's hand at the front panel.

Figure 18:
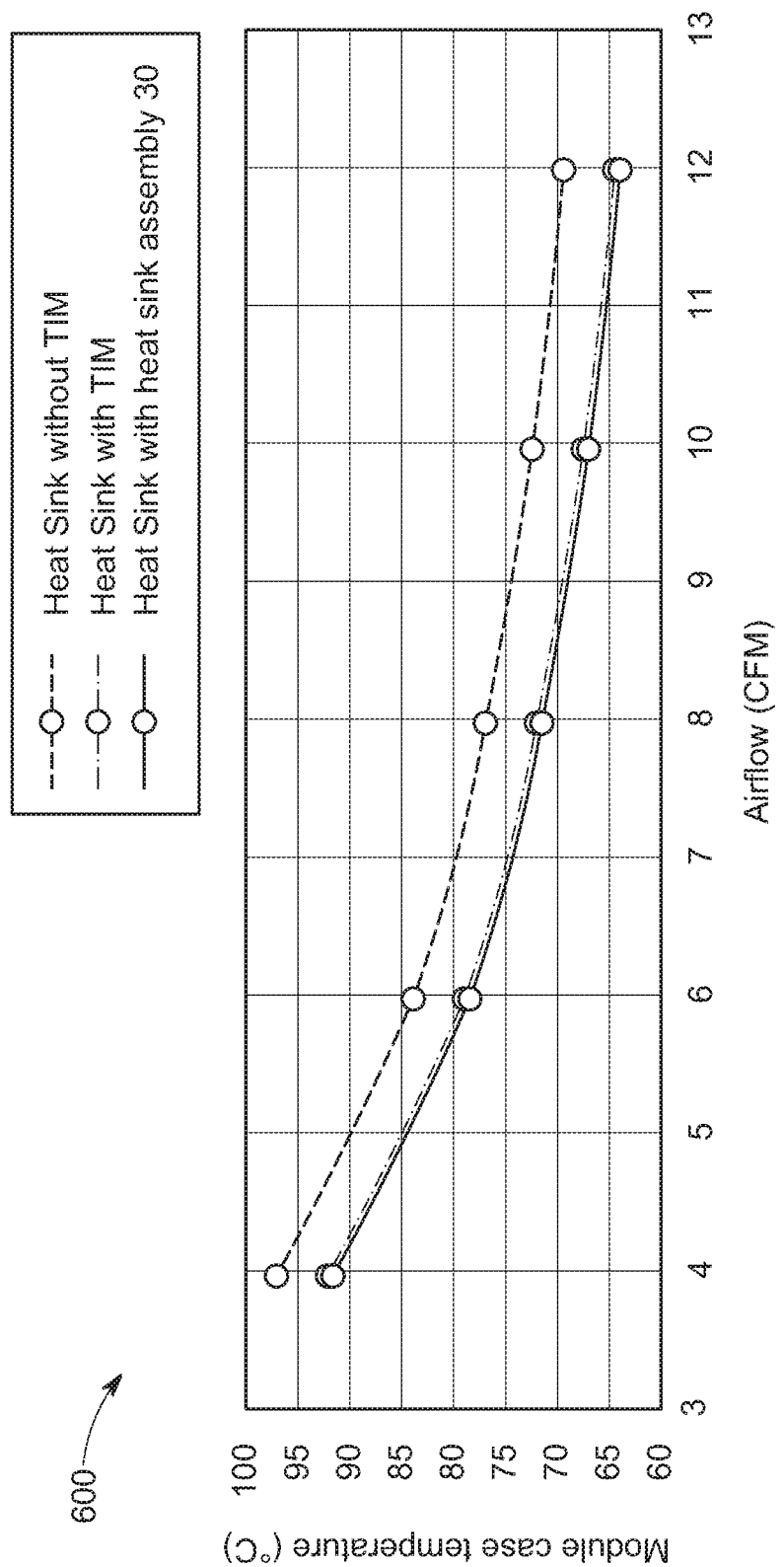
FIG. 18 is a diagram illustrating thermal advantages provided by the heat sink assembly presented herein.

In FIG. 18, diagram 600 illustrates the temperature improvements provided by the heat sink assembly 30 as compared to a heat sink 31 that is not modified to support the actuation assembly 170 of heat sink assembly 30 (e.g., a heat sink 31 of the same size, but without the features (including the TIM 35) of heat sink assembly 30 described herein). Notably, the heat sink assembly 30 presented herein achieves lower temperatures under the same airflow conditions. For example, the heat sink assembly 30 may cool a module case to 70 degree Celsius with approximately 9 cubic feet per minute (CFM) of airflow while the unmodified heat sink requires approximately 12 CFM to achieve the same temperature. Thus, the heat sink assembly 30 may provide approximately 25% improvement.

Moreover, the thermal data from diagram 600 indicates that the heat sink assembly 30 does not induce thermal spreading that mitigates improvements in contact resistance provided by the TIM 35 engaging the computing module 20. That is, forming passageway 152 and/or corners 145 in/on heat sink 31 will not generate thermal spreading that counteracts the thermal effectiveness of the heat sink 31. Thus, the heat sink assembly presented herein may support higher operational temperatures while still meeting regulatory standards. Additionally or alternatively, the heat sink assembly presented herein may reduce operating temperatures which may lower power consumption (e.g., due to reduced fan speeds) and/or reduce acoustic noise (e.g., from fans). The heat sink assembly presented herein may also achieve these advantages with an inexpensive solution that, for example, does not require expensive and maintenance intensive spring clips.

In summary, an apparatus is provided comprising: a cage defining a chamber; a heat sink to facilitate heat dissipation, the heat sink including a mating surface; a thermal interface material including a first surface and a second surface, the first surface being coupled to the mating surface of the heat sink and the second surface being opposite the first surface so that the second surface can be positioned against a perimeter of the chamber; and an actuation assembly including a shape memory alloy (SMA) element, wherein when the SMA element is in a first position, the second surface of the thermal interface material is disposed within or adjacent the perimeter of the chamber, and when the SMA element is moved to a second position, the second surface of the thermal interface material is moved a distance away from the perimeter of the chamber.

In another form, a heat sink assembly for a cage for a field replaceable computing module is provided, comprising: a heat sink to facilitate heat dissipation, the heat sink including a mating surface; a thermal interface material including a first surface and a second surface, the first surface being coupled to the mating surface of the heat sink and the second surface being opposite the first surface so that the second surface can engage a heat transfer surface of the field replaceable computing module installed adjacent the heat sink; and an actuation assembly including a shape memory alloy (SMA) element, wherein when the SMA element is in a first position, the second surface of the thermal interface material contacts the heat transfer surface of the field replaceable computing module, and when the SMA element moves to a second position, the second surface of the thermal interface material is moved a distance away from the heat transfer surface of the field replaceable computing module.

In yet another form, a system is provided, comprising: a cage defining a chamber sized to receive the field replaceable computing module with a heat transfer surface; a heat sink to facilitate heat dissipation, the heat sink including a mating surface; a thermal interface material including a first surface and a second surface, the first surface being coupled to the mating surface of the heat sink and the second surface being opposite the first surface so that the second surface can selectively engage the heat transfer surface of the field replaceable computing module when the field replaceable computing module is installed in the chamber of the cage; and an actuation assembly including a shape memory alloy (SMA) element, wherein when the field replaceable computing module is installed in the chamber of the cage and the SMA element is in a first position, the second surface of the thermal interface material contacts the heat transfer surface of the field replaceable computing module, and when the SMA element moves to a second position, the second surface of the thermal interface material is moved a distance away from the heat transfer surface of the field replaceable computing module.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims. In addition, various features from one of the embodiments may be incorporated into another of the embodiments. Accordingly, it is appropriate that the appended claims be construed broadly and in a manner consistent with the scope of the disclosure as set forth in the following claims.

It is also to be understood that the heat sink assembly, apparatus, and system presented herein described herein, or portions thereof, may be fabricated from any suitable material or combination of materials, such as plastic, metal, foamed plastic, wood, cardboard, pressed paper, supple natural or synthetic materials including, but not limited to, cotton, elastomers, polyester, plastic, rubber, derivatives thereof, and combinations thereof. Suitable plastics may include high-density polyethylene (HDPE), low-density polyethylene (LDPE), polystyrene, acrylonitrile butadiene styrene (ABS), polycarbonate, polyethylene terephthalate (PET), polypropylene, ethylene-vinyl acetate (EVA), or the like.

Finally, when used herein, the term "approximately" and terms of its family (such as "approximate," etc.) should be understood as indicating values very near to those that accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially."

What is claimed is:

1. An apparatus comprising:
    a cage defining a chamber;
    a heat sink to facilitate heat dissipation, the heat sink including a mating surface and a passageway extending through the heat sink;
    a thermal interface material including a first surface and a second surface, the first surface being coupled to the mating surface of the heat sink and the second surface being opposite the first surface to be positioned against a perimeter of the chamber; and
    an actuation assembly including a shape memory alloy (SMA) element extending through the passageway, the SMA element configured to be moveable between a first position and a second position such that when the SMA element is in the first position, the second surface of the thermal interface material is disposed within or adjacent the perimeter of the chamber, and when the SMA element is moved to the second position, the second surface of the thermal interface material is moved a distance away from the perimeter of the chamber.

2. The apparatus of claim 1, wherein the second surface of the thermal interface material is parallel to a top of the perimeter of the chamber when the SMA element is in the second position.

3. The apparatus of claim 2, wherein the heat sink is moveable with one degree of freedom when the SMA element moves between the first position and the second position.

4. The apparatus of claim 2, wherein the heat sink spans a front-to-back dimension of the chamber.

5. The apparatus of claim 1, wherein the SMA element is a one-way SMA and the actuation assembly further comprises:
    a biasing member configured to move the SMA element to the second position.

6. The apparatus of claim 1, wherein the SMA element is a two-way SMA and is configured to move between the first position and the second position in response to different magnitudes of current or in response to current being delivered to different portions of the SMA element.

7. The apparatus of claim 1, wherein the SMA element is a first SMA element and the actuation assembly further comprises:
    a second SMA element, wherein the first SMA element is configured to deform to move to the first position and the second SMA element is configured to deform to drive movement of the first SMA element to the second position.

8. The apparatus of claim 7, wherein the actuation assembly further comprises:
    a bi-stable toggle that is configured to lock the thermal interface material in specific positions after the thermal interface material is moved by the first SMA element or the second SMA element.

9. The apparatus of claim 1, further comprising:
    at least one indicator that provides an indication of a position of the thermal interface material.

10. The apparatus of claim 1, wherein the thermal interface material is configured to selectively engage a heat transfer surface of a field replaceable computing module installed in the chamber of the cage, such that the second surface of the thermal interface material contacts the heat transfer surface of the field replaceable computing module when the SMA element is in the first position and is spaced apart from the heat transfer surface of the field replaceable computing module when the SMA element is in the second position.

11. The apparatus of claim 1, wherein the actuation assembly is configured to be actuated in response to solely electrical actuation.

12. The heat sink assembly of claim 11, wherein the SMA element is directly connected to the heat sink within the passageway.

13. A heat sink assembly for a cage for a field replaceable computing module, comprising:
    a heat sink to facilitate heat dissipation, the heat sink including a mating surface and a passageway extending through the heat sink;
    a thermal interface material including a first surface and a second surface, the first surface being coupled to the mating surface of the heat sink and the second surface being opposite the first surface to engage a heat transfer surface of the field replaceable computing module installed adjacent the heat sink; and
    an actuation assembly including a shape memory alloy (SMA) element, the SMA element extending through the passageway, wherein when the SMA element is configured to be moveable between a first position and a second position such that when the SMA element is in the first position, the second surface of the thermal interface material contacts the heat transfer surface of the field replaceable computing module, and when the SMA element moves to the second position, the second surface of the thermal interface material is moved a distance away from the heat transfer surface of the field replaceable computing module.

14. The heat sink assembly of claim 13, wherein the second surface of the thermal interface material is parallel to the heat transfer surface of the field replaceable computing module when the SMA element is in the second position.

15. The heat sink assembly of claim 14, wherein the heat sink is moveable along one degree of freedom when the SMA element moves between the first position and the second position.

16. The heat sink assembly of claim 13, wherein the heat sink assembly further comprises:
   closure brackets configured to enclose the SMA element within the passageway.

17. The heat sink assembly of claim 13, wherein the SMA element is a one-way SMA and the actuation assembly further comprises:
   a biasing member configured to move the SMA element to the second position.

18. A system comprising:
   a cage defining a chamber configured to receive a field replaceable computing module with a heat transfer surface;
   a heat sink to facilitate heat dissipation, the heat sink including a mating surface and a passageway extending through the heat sink;
   a thermal interface material including a first surface and a second surface, the first surface being coupled to the mating surface of the heat sink and the second surface being opposite the first surface to selectively engage the heat transfer surface of the field replaceable computing module when the field replaceable computing module is installed in the chamber of the cage; and
   an actuation assembly including a shape memory alloy (SMA) element extending through the passageway, wherein when the field replaceable computing module is configured to be installed in the chamber of the cage and configured to be moveable between a first position and a second position such that when the SMA element is in the first position, the second surface of the thermal interface material contacts the heat transfer surface of the field replaceable computing module, and when the SMA element moves to the second position, the second surface of the thermal interface material is moved a distance away from the heat transfer surface of the field replaceable computing module.

19. The system of claim 18, further comprising:
   circuitry configured to activate a light to provide an illuminated indication when the SMA element is in at least one of the first position or the second position.

20. The system of claim 18, wherein the heat sink is moveable along one degree of freedom when the SMA element moves between the first position and the second position.

\* \* \* \* \*